United States Patent

Ohashi et al.

(10) Patent No.: US 9,728,431 B2
(45) Date of Patent: Aug. 8, 2017

(54) METHOD OF MANUFACTURING SEMICONDUCTOR DEVICE

(71) Applicant: HITACHI KOKUSAI ELECTRIC INC., Tokyo (JP)

(72) Inventors: Naofumi Ohashi, Toyama (JP); Toshiyuki Kikuchi, Toyama (JP); Shun Matsui, Toyama (JP); Tadashi Takasaki, Toyama (JP)

(73) Assignee: HITACHI KOKUSAI ELECTRIC INC., Tokyo (JP)

(*) Notice: Subject to any disclaimer, the term of this patent is extended or adjusted under 35 U.S.C. 154(b) by 0 days.

(21) Appl. No.: 14/979,898

(22) Filed: Dec. 28, 2015

(65) Prior Publication Data

US 2017/0092517 A1 Mar. 30, 2017

(30) Foreign Application Priority Data

Sep. 29, 2015 (JP) .................................. 2015-191270

(51) Int. Cl.
 *H01L 21/677* (2006.01)
 *H01L 21/67* (2006.01)
 *H01L 21/687* (2006.01)

(52) U.S. Cl.
 CPC .. *H01L 21/67196* (2013.01); *H01L 21/67201* (2013.01); *H01L 21/67781* (2013.01); *H01L 21/68707* (2013.01)

(58) Field of Classification Search
None
See application file for complete search history.

(56) References Cited

U.S. PATENT DOCUMENTS 6,074,443 A * 6/2000 Venkatesh ........ G05B 19/41865
 29/25.01
9,312,155 B2 * 4/2016 Mori ................. H01L 21/67167
 (Continued)

FOREIGN PATENT DOCUMENTS

JP 09-050948 2/1997
JP 2001-015572 1/2001
 (Continued)

OTHER PUBLICATIONS

English Translation of KIPO Office Action dated Apr. 11, 2017, submitted by Applicant on Jun. 19, 2017 but not listed on IDS.*

(Continued)

*Primary Examiner* — Michael McCullough
*Assistant Examiner* — Mark Hageman
(74) *Attorney, Agent, or Firm* — Volpe and Koenig, P.C.

(57) ABSTRACT

The present invention provides a technique for improving the productivity of a processing apparatus including a plurality of process chambers. There is provided a technique including a method for manufacturing a semiconductor device including: (a) transferring a last remaining substrate stored in an $x^{th}$ storage unit of a plurality of storage units to an empty $n^{th}$ chamber in an $m^{th}$ processing unit of a plurality of processing units; and (b) transferring a first one of a plurality of substrates stored in an $(x+1)^{th}$ storage unit of the plurality of storage units to one of chambers in an $(m+1)^{th}$ processing unit of the plurality of processing units (where x, m and n are natural numbers).

9 Claims, 17 Drawing Sheets

(56) References Cited

U.S. PATENT DOCUMENTS

| | | | |
|---|---|---|---|
| 2005/0187647 A1* | 8/2005 | Wang | H01L 21/67757 700/100 |
| 2012/0305196 A1* | 12/2012 | Mori | H01L 21/67167 156/362 |
| 2013/0302115 A1* | 11/2013 | Wakabayashi | H01L 21/67196 414/217 |
| 2015/0040828 A1 | 2/2015 | Morisawa et al. | |
| 2015/0098788 A1* | 4/2015 | Wakabayashi | H01L 21/67772 414/749.1 |

FOREIGN PATENT DOCUMENTS

| | | |
|---|---|---|
| JP | 2003-332405 A | 11/2003 |
| JP | 2008-135517 A | 6/2008 |
| JP | 2010-14100 A | 6/2010 |
| JP | 2015-035530 A | 2/2015 |
| KR | 10-2015-0018450 | 2/2015 |
| TW | 2015-21110 A | 6/2015 |

OTHER PUBLICATIONS

English Translation of TIPO Office Action, submitted by Applicant on Jun. 19, 2017 but not listed on IDS.*
Japanese Notice of Reasons for Refusal, JP Patent Application No. 2015-191270, Nov. 2, 2016, 2 pages (English translation provided).

* cited by examiner

FIG. 11

| PROCESS UNIT (PMm) | | 1 | | 2 | | 3 | | 5 | |
|---|---|---|---|---|---|---|---|---|---|
| CHAMBER (chn) | | 1 | 2 | 3 | 4 | 5 | 6 | 7 | 8 |
| WAFER NUMBER | | 1 | 2 | 3 | 4 | 5 | 6 | 7 | 8 | No.1
| | | 9 | 10 | 11 | 12 | 13 | 14 | 15 | 16 |
| | | 17 | 18 | 19 | 20 | 21 | 22 | 23 | 24 |
| | | 25 | | | | | | | |
| | | 1 | 2 | 3 | 4 | 5 | 6 | 7 | 8 | No.2
| | | 9 | 10 | 11 | 12 | 13 | 14 | 15 | 16 |
| | | 17 | 18 | 19 | 20 | 21 | 22 | 23 | 24 |
| | | 25 | | | | | | | |
| | | 1 | 2 | 3 | 4 | 5 | 6 | 7 | 8 | No.3
| | | 9 | 10 | 11 | 12 | 13 | 14 | 15 | 16 |
| | | 17 | 18 | 19 | 20 | 21 | 22 | 23 | 24 |
| | | 25 | | | | | | | |
| | | 1 | 2 | 3 | 4 | 5 | 6 | 7 | 8 | No.4
| | | 9 | 10 | 11 | 12 | 13 | 14 | 15 | 16 |
| | | 17 | 18 | 19 | 20 | 21 | 22 | 23 | 24 |
| | | 25 | | | | | | | |
| | | 1 | 2 | 3 | 4 | 5 | 6 | 7 | 8 | No.5
| | | 9 | 10 | 11 | 12 | 13 | 14 | 15 | 16 |
| | | 17 | 18 | 19 | 20 | 21 | 22 | 23 | 24 |
| | | 25 | | | | | | | |
| | | 1 | 2 | 3 | 4 | 5 | 6 | 7 | 8 | No.6
| | | 9 | 10 | 11 | 12 | 13 | 14 | 15 | 16 |
| | | 17 | 18 | 19 | 20 | 21 | 22 | 23 | 24 |
| | | 25 | | | | | | | |
| | | 1 | 2 | 3 | 4 | 5 | 6 | 7 | 8 | No.7
| | | 9 | 10 | 11 | 12 | 13 | 14 | 15 | 16 |
| | | 17 | 18 | 19 | 20 | 21 | 22 | 23 | 24 |
| | | 25 | | | | | | | |
| | | 1 | 2 | 3 | 4 | 5 | 6 | 7 | 8 | No.8
| | | 9 | 10 | 11 | 12 | 13 | 14 | 15 | 16 |
| | | 17 | 18 | 19 | 20 | 21 | 22 | 23 | 24 |
| | | 25 | | | | | | | |
| | | 1 | 2 | 3 | 4 | 5 | 6 | 7 | 8 | No.9
| | | 9 | 10 | 11 | 12 | 13 | 14 | 15 | 16 |
| | | 17 | 18 | 19 | 20 | 21 | 22 | 23 | 24 |
| | | 25 | | | | | | | |

| PROCESS UNIT (PMm) | | 1 | | 2 | | 3 | | 4 | | MAXIMUM VALUE- MINIMUM VALUE |
|---|---|---|---|---|---|---|---|---|---|---|
| CHAMBER (chn) | | 1 | 2 | 3 | 4 | 5 | 6 | 7 | 8 | |
| TOTAL USAGE COUNT | | 36 | 27 | 27 | 27 | 27 | 27 | 27 | 27 | 9 |
| FIRST SHEET USAGE COUNT | | 9 | 0 | 0 | 0 | 0 | 0 | 0 | 0 | 9 |
| 25th SHEET USAGE COUNT | | 9 | 0 | 0 | 0 | 0 | 0 | 0 | 0 | 9 |

FIG. 12

| PROCESS UNIT (PMm) | | 1 | | 2 | | 3 | | 4 | | |
|---|---|---|---|---|---|---|---|---|---|---|
| CHAMBER (chn) | | 1 | 2 | 3 | 4 | 5 | 6 | 7 | 8 | |
| WAFER NUMBER | | 1 | 2 | 3 | 4 | 5 | 6 | 7 | 8 | ⎫ No.1 |
| | | 9 | 10 | 11 | 12 | 13 | 14 | 15 | 16 | |
| | | 17 | 18 | 19 | 20 | 21 | 22 | 23 | 24 | |
| | | 25 | | 1 | 2 | 3 | 4 | 5 | 6 | ⎫ No.2 |
| | | 7 | 8 | 9 | 10 | 11 | 12 | 13 | 14 | |
| | | 15 | 16 | 17 | 18 | 19 | 20 | 21 | 22 | |
| | | 23 | 24 | 25 | | 1 | 2 | 3 | 4 | ⎫ No.3 |
| | | 5 | 6 | 7 | 8 | 9 | 10 | 11 | 12 | |
| | | 13 | 14 | 15 | 16 | 17 | 18 | 19 | 20 | |
| | | 21 | 22 | 23 | 24 | 25 | | 1 | 2 | ⎫ No.4 |
| | | 3 | 4 | 5 | 6 | 7 | 8 | 9 | 10 | |
| | | 11 | 12 | 13 | 14 | 15 | 16 | 17 | 18 | |
| | | 19 | 20 | 21 | 22 | 23 | 24 | 25 | | |
| | | 1 | 2 | 3 | 4 | 5 | 6 | 7 | 8 | ⎫ No.5 |
| | | 9 | 10 | 11 | 12 | 13 | 14 | 15 | 16 | |
| | | 17 | 18 | 19 | 20 | 21 | 22 | 23 | 24 | |
| | | 25 | | 1 | 2 | 3 | 4 | 5 | 6 | ⎫ No.6 |
| | | 7 | 8 | 9 | 10 | 11 | 12 | 13 | 14 | |
| | | 15 | 16 | 17 | 18 | 19 | 20 | 21 | 22 | |
| | | 23 | 24 | 25 | | 1 | 2 | 3 | 4 | ⎫ No.7 |
| | | 5 | 6 | 7 | 8 | 9 | 10 | 11 | 12 | |
| | | 13 | 14 | 15 | 16 | 17 | 18 | 19 | 20 | |
| | | 21 | 22 | 23 | 24 | 25 | | 1 | 2 | ⎫ No.8 |
| | | 3 | 4 | 5 | 6 | 7 | 8 | 9 | 10 | |
| | | 11 | 12 | 13 | 14 | 15 | 16 | 17 | 18 | |
| | | 19 | 20 | 21 | 22 | 23 | 24 | 25 | | |
| | | 1 | 2 | 3 | 4 | 5 | 6 | 7 | 8 | ⎫ No.9 |
| | | 9 | 10 | 11 | 12 | 13 | 14 | 15 | 16 | |
| | | 17 | 18 | 19 | 20 | 21 | 22 | 23 | 24 | |
| | | 25 | | 1 | 2 | 3 | 4 | 5 | 6 | ⎫ No.10 |
| | | 7 | 8 | 9 | 10 | 11 | 12 | 13 | 14 | |
| | | 15 | 16 | 17 | 18 | 19 | 20 | 21 | 22 | |
| | | 23 | 24 | 25 | | | | | | |

| PROCESS UNIT (PMm) | 1 | | 2 | | 3 | | 4 | | MAXIMUM VALUE − MINIMUM VALUE |
|---|---|---|---|---|---|---|---|---|---|
| CHAMBER (chn) | 1 | 1 | 1 | 1 | 1 | 1 | 1 | 1 | |
| TOTAL USAGE COUNT | 33 | 30 | 33 | 30 | 32 | 30 | 32 | 30 | 3 |
| FIRST SHEET USAGE COUNT | 3 | 0 | 3 | 0 | 2 | 0 | 2 | 0 | 3 |
| 25th SHEET USAGE COUNT | 3 | 0 | 3 | 0 | 2 | 0 | 2 | 0 | 3 |

FIG. 13

| PROCESS UNIT (PMm) | 1 | | 2 | | 3 | | 4 | |
|---|---|---|---|---|---|---|---|---|
| CHAMBER (chn) | 1 | 2 | 3 | 4 | 5 | 6 | 7 | 8 |
| WAFER NUMBER | 1 | 2 | 3 | 4 | 5 | 6 | 7 | 8 |
| | 9 | 10 | 11 | 12 | 13 | | 1 | 2 |
| | 3 | 4 | 5 | 6 | 7 | 8 | 9 | 10 |
| | 11 | 12 | 13 | | 1 | 2 | 3 | 4 |
| | 5 | 6 | 7 | 8 | 9 | 10 | 11 | 12 |
| | 13 | | 1 | 2 | 3 | 4 | 5 | 6 |
| | 7 | 8 | 9 | 10 | 11 | 12 | 13 | |
| | 1 | 2 | 3 | 4 | 5 | 6 | 7 | 8 |
| | 9 | 10 | 11 | 12 | 13 | | 1 | 2 |
| | 3 | 4 | 5 | 6 | 7 | 8 | 9 | 10 |
| | 11 | 12 | 13 | | 1 | 2 | 3 | 4 |
| | 5 | 6 | 7 | 8 | 9 | 10 | 11 | 12 |
| | 13 | | 1 | 2 | 3 | 4 | 5 | 6 |
| | 7 | 8 | 9 | 10 | 11 | 12 | 13 | |
| | 1 | 2 | 3 | 4 | 5 | 6 | 7 | 8 |
| | 9 | 10 | 11 | 12 | 13 | | 1 | 2 |
| | 3 | 4 | 5 | 6 | 7 | 8 | 9 | 10 |
| | 11 | 12 | 13 | | | | | |

| PROCESS UNIT (PMm) | 1 | | 2 | | 3 | | 4 | | MAXIMUM VALUE- MINIMUM VALUE |
|---|---|---|---|---|---|---|---|---|---|
| CHAMBER (chn) | 1 | 2 | 3 | 4 | 5 | 6 | 7 | 8 | |
| TOTAL USAGE COUNT | 18 | 16 | 18 | 15 | 17 | 14 | 17 | 15 | 4 |
| FIRST SHEET USAGE COUNT | 3 | 0 | 2 | 0 | 2 | 0 | 3 | 0 | 3 |
| 13th SHEET USAGE COUNT | 2 | 0 | 3 | 0 | 3 | 0 | 2 | 0 | 3 |

FIG. 14

| PROCESS UNIT (PMm) | 1 | | 2 | | 3 | | 4 | | |
|---|---|---|---|---|---|---|---|---|---|
| CHAMBER (chn) | 1 | 2 | 3 | 4 | 5 | 6 | 7 | 8 | |
| WAFER NUMBER | 1 | 2 | 3 | 4 | 5 | 6 | 7 | 8 | ⎫ No.1 |
|  | 9 | 10 | 11 | 12 | 13 | 14 | 15 | 16 |  |
|  | 17 | 18 | 19 | 20 | 21 | 22 | 23 | 24 | ⎭ |
|  | 25 |  | 1 | 2 | 3 | 4 | 5 | 6 | ⎫ No.2 |
|  | 7 | 8 | 9 | 10 | 11 | 12 | 13 | 14 |  |
|  | 15 | 16 | 17 | 18 | 19 | 20 | 21 | 22 |  |
|  | 23 | 24 |  |  |  |  |  |  | ⎭ |
|  |  | 25 | 1 | 2 | 3 | 4 | 5 | 6 | ⎫ No.3 |
|  | 7 | 8 | 9 | 10 | 11 | 12 | 13 | 14 |  |
|  | 15 | 16 | 17 | 18 | 19 | 20 | 21 | 22 | ⎭ |
|  | 23 | 24 | 25 |  | 1 | 2 | 3 | 4 | ⎫ No.4 |
|  | 5 | 6 | 7 | 8 | 9 | 10 | 11 | 12 |  |
|  | 13 | 14 | 15 | 16 | 17 | 18 | 19 | 20 |  |
|  | 21 | 22 | 23 | 24 |  |  |  |  | ⎭ |
|  |  |  |  | 25 | 1 | 2 | 3 | 4 | ⎫ No.5 |
|  | 5 | 6 | 7 | 8 | 9 | 10 | 11 | 12 |  |
|  | 13 | 14 | 15 | 16 | 17 | 18 | 19 | 20 | ⎭ |
|  | 21 | 22 | 23 | 24 | 25 |  | 1 | 2 | ⎫ No.6 |
|  | 3 | 4 | 5 | 6 | 7 | 8 | 9 | 10 |  |
|  | 11 | 12 | 13 | 14 | 15 | 16 | 17 | 18 |  |
|  | 19 | 20 | 21 | 22 | 23 | 24 |  |  | ⎭ |
|  |  |  |  |  |  | 25 | 1 | 2 | ⎫ No.7 |
|  | 3 | 4 | 5 | 6 | 7 | 8 | 9 | 10 |  |
|  | 11 | 12 | 13 | 14 | 15 | 16 | 17 | 18 |  |
|  | 19 | 20 | 21 | 22 | 23 | 24 | 25 |  | ⎭ |
|  | 1 | 2 | 3 | 4 | 5 | 6 | 7 | 8 | ⎫ No.8 |
|  | 9 | 10 | 11 | 12 | 13 | 14 | 15 | 16 |  |
|  | 17 | 18 | 19 | 20 | 21 | 22 | 23 | 24 |  |
|  |  |  |  |  |  |  |  | 25 | ⎭ |
|  | 1 | 2 | 3 | 4 | 5 | 6 | 7 | 8 | ⎫ No.9 |
|  | 9 | 10 | 11 | 12 | 13 | 14 | 15 | 16 |  |
|  | 17 | 18 | 19 | 20 | 21 | 22 | 23 | 24 | ⎭ |
|  | 25 |  | 1 | 2 | 3 | 4 | 5 | 6 | ⎫ No.10 |
|  | 7 | 8 | 9 | 10 | 11 | 12 | 13 | 14 |  |
|  | 15 | 16 | 17 | 18 | 19 | 20 | 21 | 22 |  |
|  | 23 | 24 |  |  |  |  |  |  |  |
|  |  | 25 |  |  |  |  |  |  | ⎭ |

| PROCESS UNIT (PMm) | 1 | | 2 | | 3 | | 4 | | MAXIMUM VALUE- MINIMUM VALUE |
|---|---|---|---|---|---|---|---|---|---|
| CHAMBER (chn) | 1 | 2 | 3 | 4 | 5 | 6 | 7 | 8 | |
| TOTAL USAGE COUNT | 32 | 32 | 31 | 31 | 31 | 31 | 31 | 31 | 1 |
| FIRST SHEET USAGE COUNT | 3 | 0 | 3 | 0 | 2 | 0 | 2 | 0 | 3 |
| 25th SHEET USAGE COUNT | 2 | 2 | 1 | 1 | 1 | 1 | 1 | 1 | 1 |

FIG. 15

| PROCESS UNIT (PMm) | 1 | | 2 | | 3 | | 4 | |
|---|---|---|---|---|---|---|---|---|
| CHAMBER (chn) | 1 | 2 | 3 | 4 | 5 | 6 | 7 | 8 |
| WAFER NUMBER | 1 | 2 | 3 | 4 | 5 | 6 | 7 | 8 |
| | 9 | 10 | 11 | 12 | 13 | | 1 | 2 |
| | 3 | 4 | 5 | 6 | 7 | 8 | 9 | 10 |
| | 11 | 12 | | | | 13 | 1 | 2 |
| | 3 | 4 | 5 | 6 | 7 | 8 | 9 | 10 |
| | 11 | 12 | | | | 13 | | |
| | 1 | 2 | 3 | 4 | 5 | 6 | 7 | 8 |
| | 9 | 10 | 11 | 12 | | | | 13 |
| | 1 | 2 | 3 | 4 | 5 | 6 | 7 | 8 |
| | 9 | 10 | 11 | 12 | | | | |
| | 13 | | 1 | 2 | 3 | 4 | 5 | 6 |
| | 7 | 8 | 9 | 10 | 11 | 12 | | |
| | | 13 | 1 | 2 | 3 | 4 | 5 | 6 |
| | 7 | 8 | 9 | 10 | 11 | 12 | 13 | |
| | | | 13 | | 1 | 2 | 3 | 4 |
| | 5 | 6 | 7 | 8 | 9 | 10 | 11 | 12 |
| | | | | 13 | 1 | 2 | 3 | 4 |
| | 5 | 6 | 7 | 8 | 9 | 10 | 11 | 12 |
| | | | | | 13 | | 1 | 2 |
| | 3 | 4 | 5 | 6 | 7 | 8 | 9 | 10 |
| | 11 | 12 | | | | 13 | | |

| PROCESS UNIT (PMm) | 1 | | 2 | | 3 | | 4 | | MAXIMUM VALUE- MINIMUM VALUE |
|---|---|---|---|---|---|---|---|---|---|
| CHAMBER (chn) | 1 | 2 | 3 | 4 | 5 | 6 | 7 | 8 | |
| TOTAL USAGE COUNT | 17 | 17 | 16 | 16 | 16 | 16 | 16 | 16 | 1 |
| FIRST SHEET USAGE COUNT | 3 | 0 | 2 | 0 | 2 | 0 | 3 | 0 | 3 |
| 13th SHEET USAGE COUNT | 1 | 1 | 1 | 1 | 2 | 2 | 1 | 1 | 1 |

FIG. 16

| PROCESS UNIT (PMm) | 1 | | 2 | | 3 | | 4 | | |
|---|---|---|---|---|---|---|---|---|---|
| CHAMBER (chn) | 1 | 2 | 3 | 4 | 5 | 6 | 7 | 8 | |
| WAFER NUMBER | 1 | 2 | 4 | 3 | 5 | 6 | 8 | 7 | ⎫ |
| | 9 | 10 | 12 | 11 | 13 | 14 | 16 | 15 | ⎬ No.1 |
| | 17 | 18 | 20 | 19 | 21 | 22 | 24 | 23 | ⎭ |
| | 25 | | 2 | 1 | 3 | 4 | 6 | 5 | ⎫ |
| | 7 | 8 | 10 | 9 | 11 | 12 | 14 | 13 | ⎬ No.2 |
| | 15 | 16 | 18 | 17 | 19 | 20 | 22 | 21 | |
| | 23 | 24 | | | | | | | ⎭ |
| | | 25 | 1 | 2 | 4 | 3 | 5 | 6 | ⎫ |
| | 8 | 7 | 9 | 10 | 12 | 11 | 13 | 14 | ⎬ No.3 |
| | 16 | 15 | 17 | 18 | 20 | 19 | 21 | 22 | ⎭ |
| | 24 | 23 | 25 | | 2 | 1 | 3 | 4 | ⎫ |
| | 6 | 5 | 7 | 8 | 10 | 9 | 11 | 12 | ⎬ No.4 |
| | 14 | 13 | 15 | 16 | 18 | 17 | 19 | 20 | |
| | 22 | 21 | 23 | 24 | | | | | ⎭ |
| | | | | 25 | 1 | 2 | 4 | 3 | ⎫ |
| | 5 | 6 | 8 | 7 | 9 | 10 | 12 | 11 | ⎬ No.5 |
| | 13 | 14 | 16 | 15 | 17 | 18 | 20 | 19 | ⎭ |
| | 21 | 22 | 24 | 23 | 25 | | 2 | 1 | ⎫ |
| | 3 | 4 | 6 | 5 | 7 | 8 | 10 | 9 | ⎬ No.6 |
| | 11 | 12 | 14 | 13 | 15 | 16 | 18 | 17 | |
| | 19 | 20 | 22 | 21 | 23 | 24 | | | ⎭ |
| | | | | | 25 | 1 | | 2 | ⎫ |
| | 4 | 3 | 5 | 6 | 8 | 7 | 9 | 10 | ⎬ No.7 |
| | 12 | 11 | 13 | 14 | 16 | 15 | 17 | 18 | ⎭ |
| | 20 | 19 | 21 | 22 | 24 | 23 | 25 | | ⎫ |
| | 2 | 1 | 3 | 4 | 6 | 5 | 7 | 8 | ⎬ No.8 |
| | 10 | 9 | 11 | 12 | 14 | 13 | 15 | 16 | |
| | 18 | 17 | 19 | 20 | 22 | 21 | 23 | 24 | |
| | | | | | | | | 25 | ⎭ |
| | 1 | 2 | 4 | 3 | 5 | 6 | 8 | 7 | ⎫ |
| | 9 | 10 | 12 | 11 | 13 | 14 | 16 | 15 | ⎬ No.9 |
| | 17 | 18 | 20 | 19 | 21 | 22 | 24 | 23 | ⎭ |
| | 25 | | 2 | 1 | 3 | 4 | 6 | 5 | ⎫ |
| | 7 | 8 | 10 | 9 | 11 | 12 | 14 | 13 | ⎬ No.10 |
| | 15 | 16 | 18 | 17 | 19 | 20 | 22 | 21 | |
| | 23 | 24 | | | | | | | |
| | | 25 | | | | | | | ⎭ |

| PROCESS UNIT (PMm) | 1 | | 2 | | 3 | | 4 | | MAXIMUM VALUE |
|---|---|---|---|---|---|---|---|---|---|
| CHAMBER (chn) | 1 | 2 | 3 | 4 | 5 | 6 | 7 | 8 | -MINIMUM VALUE |
| TOTAL USAGE COUNT | 32 | 32 | 31 | 31 | 31 | 31 | 31 | 31 | 1 |
| FIRST SHEET USAGE COUNT | 2 | 1 | 1 | 2 | 1 | 1 | 1 | 1 | 1 |
| 25th SHEET USAGE COUNT | 2 | 2 | 1 | 1 | 1 | 1 | 1 | 1 | 1 |

FIG. 17

| PROCESS UNIT (PMm) | 1 | | 2 | | 3 | | 4 | |
|---|---|---|---|---|---|---|---|---|
| CHAMBER (chn) | 1 | 2 | 3 | 4 | 5 | 6 | 7 | 8 |
| WAFER NUMBER | 1 | 2 | 4 | 3 | 5 | 6 | 8 | 7 |
| | 9 | 10 | 12 | 11 | 13 | | 2 | 1 |
| | 3 | 4 | 6 | 5 | 7 | 8 | 10 | 9 |
| | 11 | 12 | | | | 13 | 1 | 2 |
| | 4 | 3 | 5 | 6 | 8 | 7 | 9 | 10 |
| | 12 | 11 | | | | | 13 | |
| | 2 | 1 | 3 | 4 | 6 | 5 | 7 | 8 |
| | 10 | 9 | 11 | 12 | | | | 13 |
| | 1 | 2 | 4 | 3 | 5 | 6 | 8 | 7 |
| | 9 | 10 | 12 | 11 | | | | |
| | 13 | | 2 | 1 | 3 | 4 | 6 | 5 |
| | 7 | 8 | 10 | 9 | 11 | 12 | | |
| | | 13 | 1 | 2 | 4 | 3 | 5 | 6 |
| | 8 | 7 | 9 | 10 | 12 | 11 | | |
| | | | 13 | | 2 | 1 | 3 | 4 |
| | 6 | 5 | 7 | 8 | 10 | 9 | 11 | 12 |
| | | | | 13 | 1 | 2 | 4 | 3 |
| | 5 | 6 | 8 | 7 | 9 | 10 | 12 | 11 |
| | | | | | | 13 | 2 | 1 |
| | 3 | 4 | 6 | 5 | 7 | 8 | 10 | 9 |
| | 11 | 12 | | | | 13 | | |

| PROCESS UNIT (PMm) | 1 | | 2 | | 3 | | 4 | | MAXIMUM VALUE- MINIMUM VALUE |
|---|---|---|---|---|---|---|---|---|---|
| CHAMBER (chn) | 1 | 2 | 3 | 4 | 5 | 6 | 7 | 8 | |
| TOTAL USAGE COUNT | 17 | 17 | 16 | 16 | 16 | 16 | 16 | 16 | 1 |
| FIRST SHEET USAGE COUNT | 2 | 1 | 1 | 1 | 1 | 1 | 1 | 1 | 1 |
| 13th SHEET USAGE COUNT | 1 | 1 | 1 | 1 | 2 | 2 | 1 | 1 | 1 |

METHOD OF MANUFACTURING SEMICONDUCTOR DEVICE

CROSS-REFERENCE TO RELATED PATENT APPLICATION

This non-provisional U.S. patent application claims priority under 35 U.S.C. §119 of Japanese Patent Application No. 2015-191270, filed on Sep. 29, 2015, the entire contents of which are hereby incorporated by reference.

BACKGROUND

1. Field

The present invention relates to a substrate processing apparatus, a method of manufacturing a semiconductor device and a non-transitory computer-readable recording medium.

2. Description of the Related Art

Recently, semiconductor devices have been manufactured in small lots and in multiple types of products. When semiconductor devices are manufactured in small lots and in multiple types of products, improvements in productivity are required. As one method that satisfies this requirement, there is a method for improving the productivity of a single wafer processing apparatus including a plurality of process chambers.

SUMMARY

There is a challenge in that productivity is reduced by the mismatch between the number of process chambers installed in a processing apparatus and the number of processed wafers.

The present invention provides a technique capable of improving the productivity of a processing apparatus including a plurality of process chambers.

According to an aspect of the present invention, there is provided a technique including a method for manufacturing a semiconductor device using an apparatus including: a plurality of processing units including a plurality of chambers where a plurality of substrates are processed; a vacuum transfer chamber connected to the plurality of processing units; a load lock chamber connected to the vacuum transfer chamber; a stage where a plurality of storage units loaded with the plurality of substrates are placed; an atmosphere transfer chamber disposed between the load lock chamber and the stage and having a first transfer robot installed therein; and a second transfer robot disposed in the vacuum transfer chamber and configured to transfer the plurality of substrates between the load lock chamber and the plurality of chamber, the method including:

(a) transferring a last remaining substrate stored in an $x^{th}$ storage unit of the plurality of storage units to an empty $n^{th}$ chamber in an $m^{th}$ processing unit of the plurality of processing units; and (b) transferring a first one of the plurality of substrates stored in an $(x+1)^{th}$ storage unit of the plurality of storage units to one of chambers in an $(m+1)^{th}$ processing unit of the plurality of processing units (where x, m and n are natural numbers).

BRIEF DESCRIPTION OF THE DRAWINGS

FIG. 11 is a diagram illustrating a conventional transfer sequence.

FIG. 12 is an example of a transfer sequence a of 25 wafers according to an embodiment of the present invention.

FIG. 13 is an example of a transfer sequence a of 13 wafers according to an embodiment of the present invention.

FIG. 14 is an example of a transfer sequence b of 25 wafers according to an embodiment of the present invention.

FIG. 15 is an example of a transfer sequence b of 13 wafers according to an embodiment of the present invention.

FIG. 16 is an example of a transfer sequence c of 25 wafers according to an embodiment of the present invention.

FIG. 17 is an example of a transfer sequence c of 13 wafers according to an embodiment of the present invention.

DETAILED DESCRIPTION OF THE PREFERRED EMBODIMENTS

<First Embodiment>

Hereinafter, a first embodiment of the present invention will be described with reference to the drawings.

Hereinafter, a substrate processing system according to the present embodiment will be described.

(1) Configuration of Substrate Processing System

Figure 1:
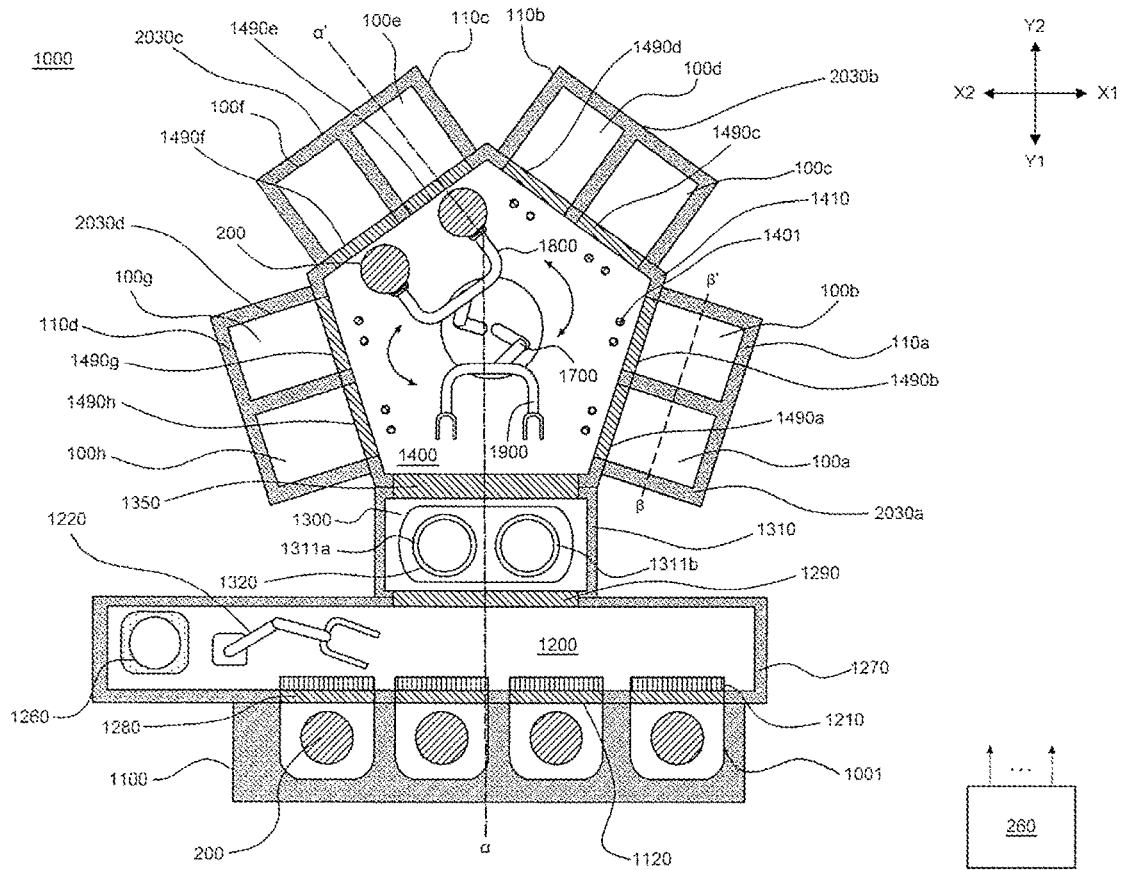
FIG. 1 is a cross-sectional schematic view of a substrate processing system according to an embodiment of the present invention.
Figure 2:
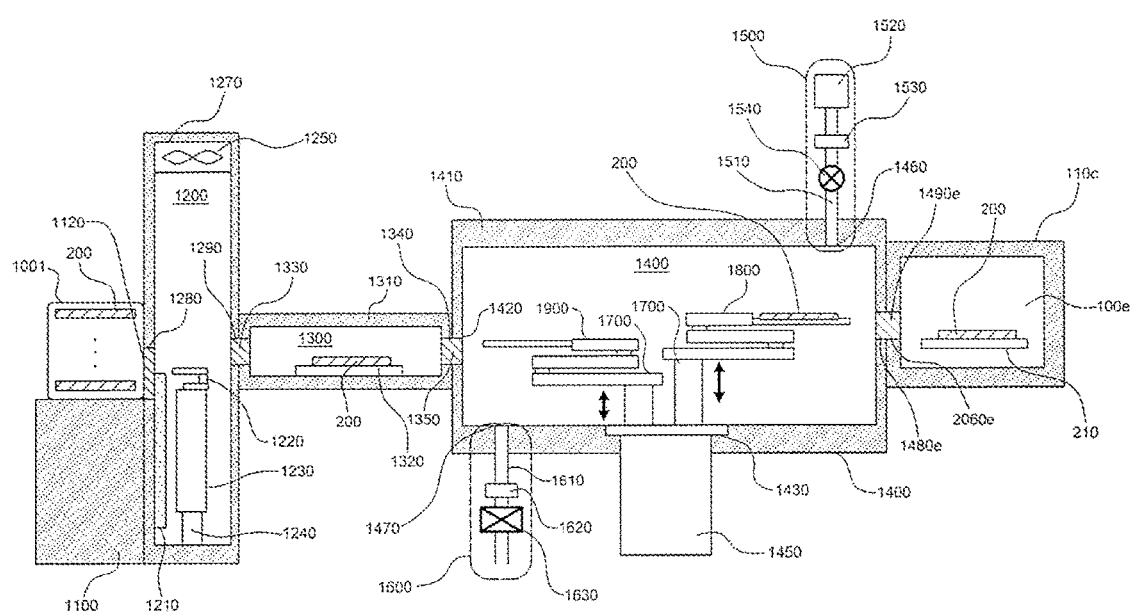
FIG. 2 is a longitudinal sectional schematic view illustrating the substrate processing system according to an embodiment of the present invention.
Figure 3:
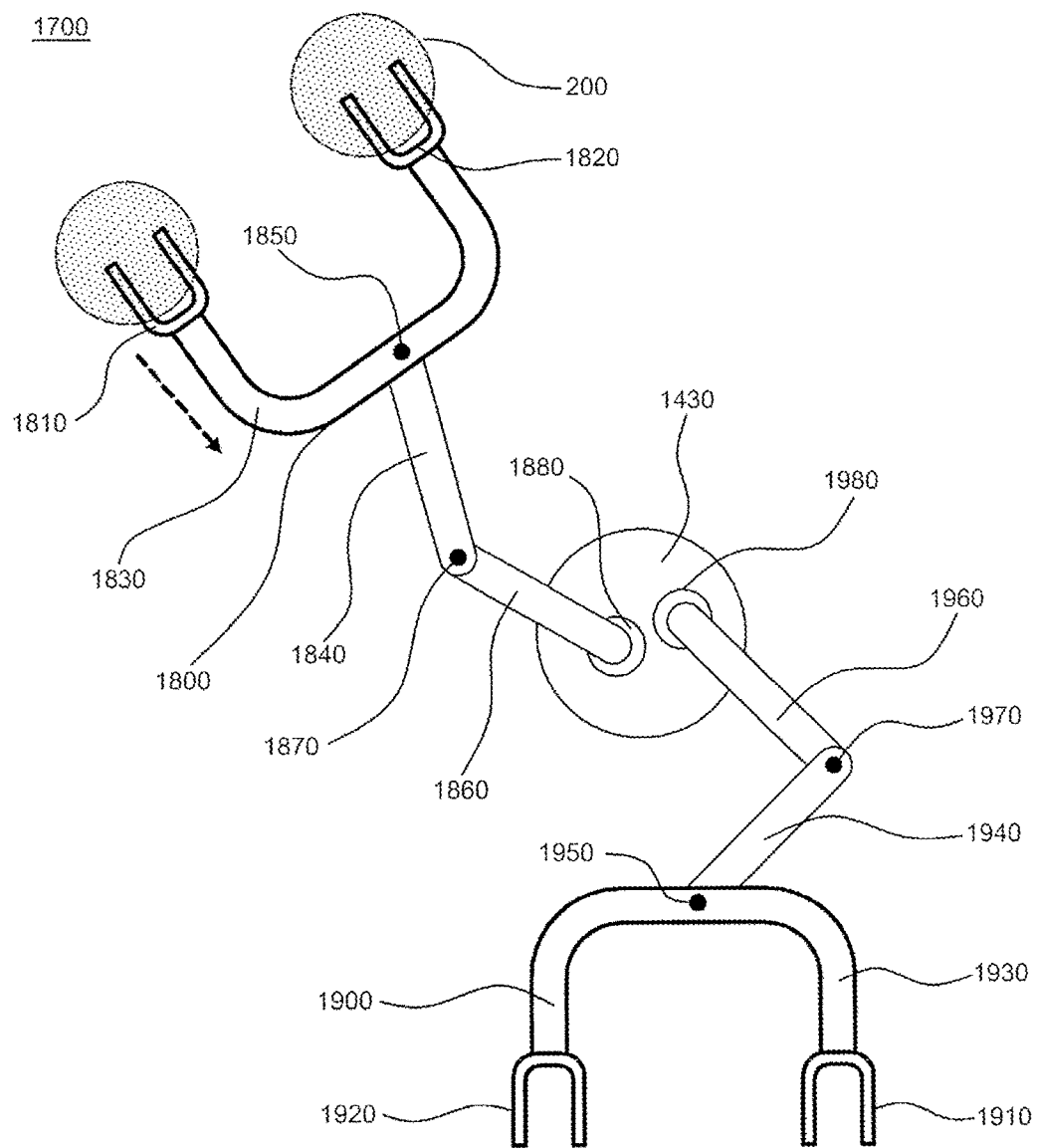
FIG. 3 is a schematic view of a vacuum transfer robot illustrating the substrate processing system according to an embodiment of the present invention.
Figure 4:
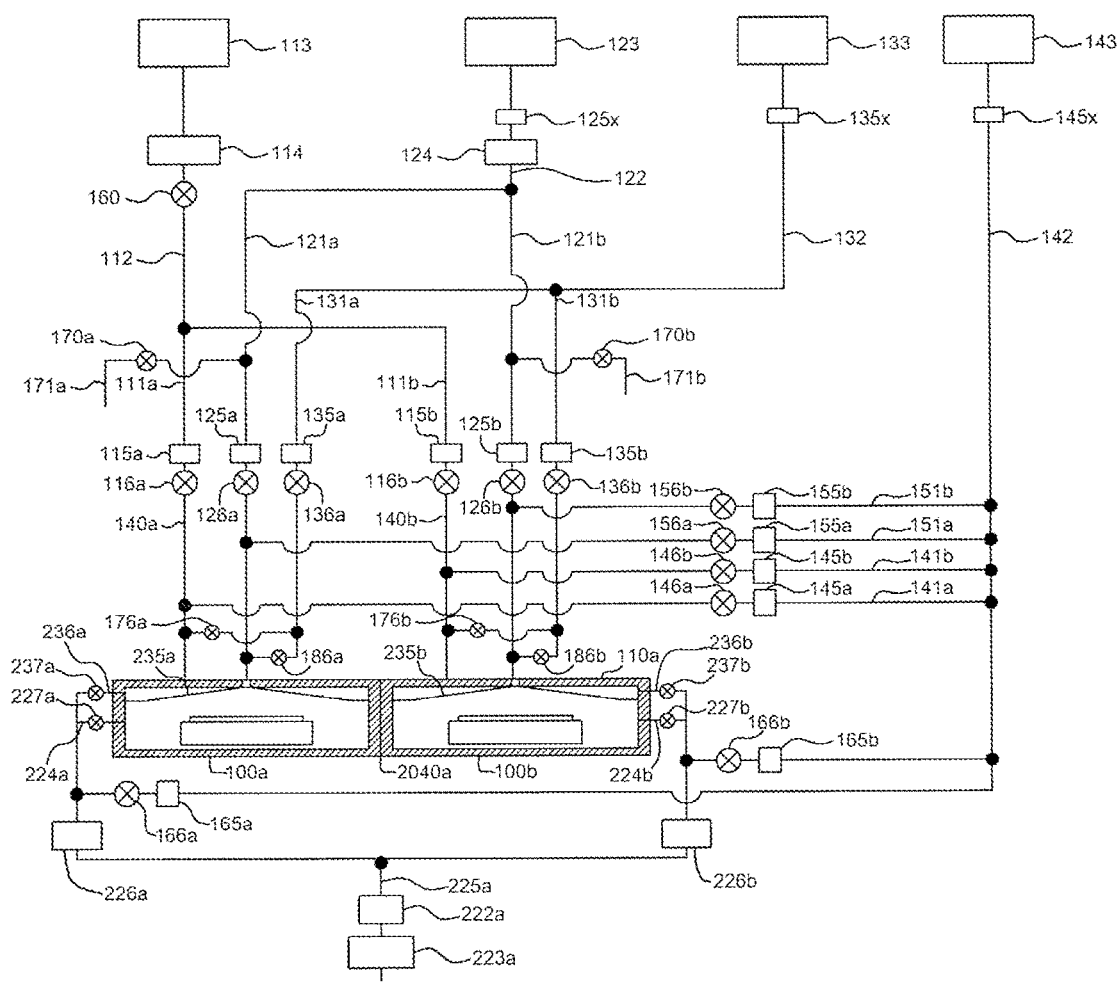
FIG. 4 is a configuration diagram schematically illustrating a substrate processing apparatus according to an embodiment of the present invention.
Figure 5:
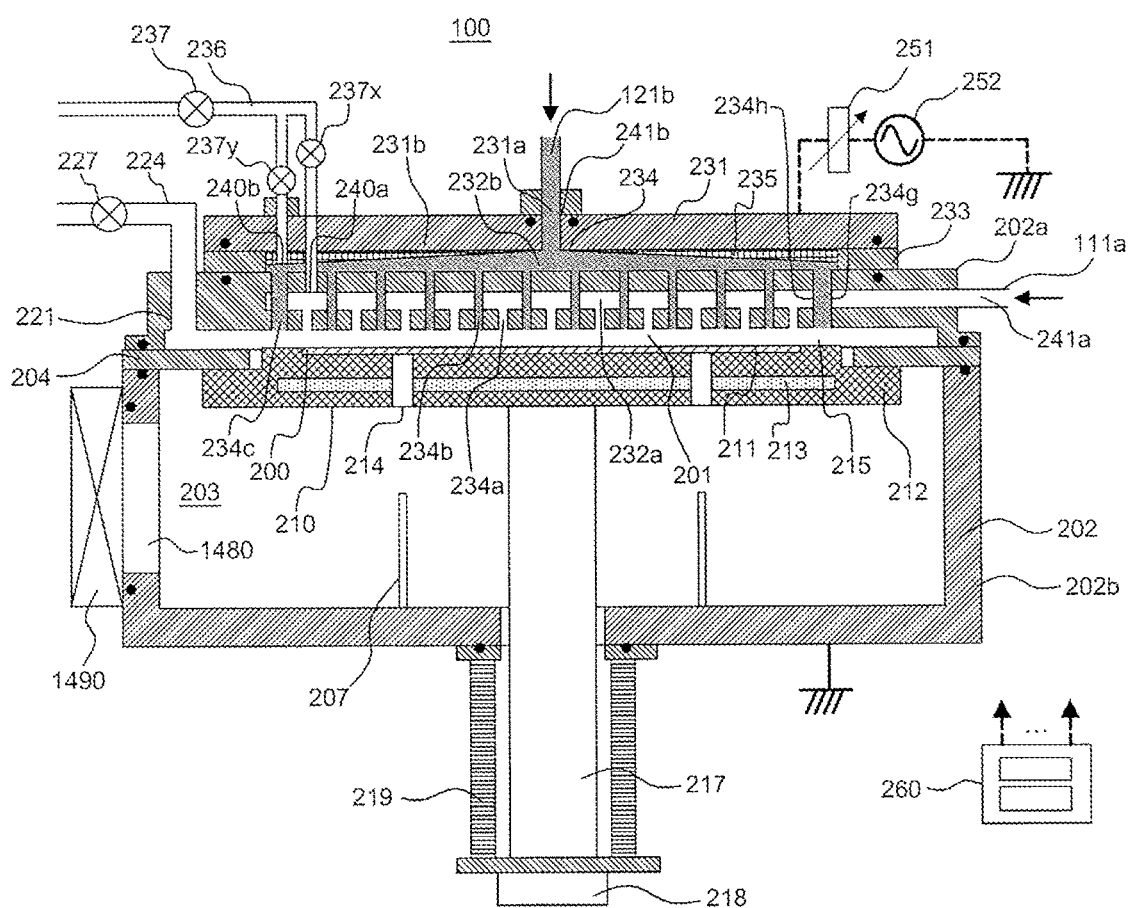
FIG. 5 is a longitudinal sectional schematic view illustrating a chamber according to an embodiment of the present invention.

A configuration of a substrate processing system according to an embodiment of the present invention will be described with reference to FIGS. 1 through 4. FIG. 1 is a cross-sectional view illustrating an example of the configuration of the substrate processing system according to the present embodiment. FIG. 2 is a longitudinal sectional view taken along line α-α' of FIG. 1 illustrating an example of the configuration of the substrate processing system according to the present embodiment. FIG. 3 is an explanatory diagram for describing an arm of FIG. 1 in detail. FIG. 4 is a longitudinal sectional view taken along line β-β' of FIG. 1 and an explanatory diagram for describing a gas supply system for supplying a gas to a process module. FIG. 5 is an explanatory diagram for describing a chamber installed in the process module.

In FIGS. 1 and 2, a substrate processing system 1000 to which the present invention is applied processes wafers 200 and mainly includes an input and output (IO) stage 1100, an atmosphere transfer chamber 1200, a load lock chamber 1300, a vacuum transfer chamber 1400 and process modules 110. Next, each of the components will be described in detail. In FIG. 1, a direction X1 is defined as the right, a direction X2 as the left, a direction Y1 as the front and a direction Y2 as the rear. Also, a semiconductor device is formed on a surface of the wafer 200 and a process of manufacturing the semiconductor device is performed in the substrate processing system 1000. Here, the semiconductor device includes at least one of integrated circuits (ICs) and electronic elements (resistance elements, coil elements, capacitor elements and semiconductor devices). Also, the semiconductor device may include a dummy film required during the manufacture of the semiconductor device.

(Atmosphere Transfer Chamber and IO Stage)

The IO stage (loading port) 1100 is installed in front of the substrate processing system 1000. A plurality of pods 1001 are mounted on the IO stage 1100. The pod 1001 is used as a carrier that transfers the substrate (wafer) 200 such as a silicon (Si) substrate or the like and is configured to store a plurality of unprocessed substrates 200 or processed substrates 200 in a horizontal posture.

Caps 1120 are installed in the pods 1001 and are opened and closed by pod openers 1210 to be described below. When one of the pod openers 1210 opens or closes the cap 1120 of the pod 1001 placed on the IO stage 1100 and opens or closes a substrate loading and unloading port, the substrate 200 may be loaded or unloaded into or from the pod 1001. The pod 1001 is supplied to or discharged from the IO stage 1100 by an in-process transfer device (such as RGV) (not illustrated).

The IO stage 1100 is adjacent to the atmosphere transfer chamber 1200. The load lock chamber 1300 to be described below is connected to a surface opposite to a surface of the atmosphere transfer chamber 1200 in contact with the IO stage 1100.

An atmosphere transfer robot 1220 serving as a first transfer robot that transfers the substrate 200 is installed in the atmosphere transfer chamber 1200. As illustrated in FIG. 2, the atmosphere transfer robot 1220 is configured to be lifted by an elevator 1230 installed in the atmosphere transfer chamber 1200 and is configured to laterally reciprocate by a linear actuator 1240.

As illustrated in FIG. 2, a clean unit 1250 that supplies clean air is installed on an upper portion of the atmosphere transfer chamber 1200. Also, as illustrated in FIG. 1, a notch or orientation flat aligning device (hereinafter referred to as a pre-aligner) 1260, which is formed on the substrate 200, is installed at a left side of the atmosphere transfer chamber 1200.

As illustrated in FIGS. 1 and 2, a substrate loading and unloading port 1280 that loads or unloads the substrate 200 into or from the atmosphere transfer chamber 1200 and the pod opener 1210 are installed at a front side of a housing 1270 of the atmosphere transfer chamber 1200. The IO stage 1100 (loading port) is installed at a side opposite to the pod opener 1210, that is, at an outer side of the housing 1270, with the substrate loading and unloading port 1280 therebetween.

A substrate loading and unloading port 1290 that loads or unloads the wafer 200 into or from the load lock chamber 1300 is installed at a rear side of the housing 1270 of the atmosphere transfer chamber 1200. When the substrate loading and unloading port 1290 is opened or closed by a gate valve 1330 to be described below, the wafer 200 may be loaded or unloaded.

(Load Lock (L/L) Chamber)

The load lock chamber 1300 is adjacent to the atmosphere transfer chamber 1200. As described below, the vacuum transfer chamber 1400 is disposed on a surface opposite to a surface in contact with the atmosphere transfer chamber 1200 among surfaces of a housing 1310 constituting the load lock chamber 1300. Since an inner pressure of the housing 1310 is changed according to an inner pressure of the atmosphere transfer chamber 1200 and an inner pressure of the vacuum transfer chamber 1400, the load lock chamber 1300 is configured to have a structure that can withstand a negative pressure.

A substrate loading and unloading port 1340 is installed at a side adjacent to the vacuum transfer chamber 1400 among sides of the housing 1310. When the substrate loading and unloading port 1340 is opened or closed by a gate valve 1350, the wafer 200 may be loaded or unloaded.

Also, a substrate placement unit 1320 including at least two placement surfaces 1311 that place the wafer 200 is installed in the load lock chamber 1300. Here, the two placement surfaces 1311 include a first placement surface 1311a and a second placement surface 1311b. A distance between the substrate placement surfaces 1311 is set according to a distance between fingers included in a vacuum transfer robot 1700 to be described below.

(Vacuum Transfer Chamber)

The substrate processing system 1000 includes the vacuum transfer chamber (transfer module) 1400 serving as a transfer chamber which is a transfer space in which the substrate 200 is transferred under a negative pressure. A housing 1410 constituting the vacuum transfer chamber 1400 is formed to have a pentagonal shape in a plan view, and the load lock chamber 1300 and process modules 110a through 110d in which the wafers 200 are processed are connected to each side of the pentagon. The vacuum transfer robot 1700 serving as a second transfer robot that transfers the substrate 200 under a negative pressure is installed at a center portion of the vacuum transfer chamber 1400 using a flange 1430 as a base. Also, here, although the vacuum transfer chamber 1400 has a pentagonal shape as an example, it may have a polygonal shape such as a rectangular shape, a hexagonal shape or the like. Also, preferably, an even number of process modules are installed.

A substrate loading and unloading port 1420 is installed at a sidewall adjacent to the load lock chamber 1300 among sidewalls of the housing 1410. When the substrate loading and unloading port 1420 is opened or closed by the gate valve 1350, the wafer 200 may be loaded or unloaded.

As illustrated in FIG. 2, the vacuum transfer robot 1700 installed in the vacuum transfer chamber 1400 is configured to perform lifting by an elevator 1450 and the flange 1430 while airtightness of the vacuum transfer chamber 1400 is maintained. A configuration of the vacuum transfer robot 1700 will be described in detail below. The elevator 1450 is configured to individually lift two arms 1800 and 1900 included in the vacuum transfer robot 1700.

An inert gas supply hole 1460 that supplies an inert gas into the housing 1410 is installed at a ceiling portion of the housing 1410. An inert gas supply pipe 1510 is installed in the inert gas supply hole 1460. In the inert gas supply pipe 1510, an inert gas source 1520, a mass flow controller 1530 and a valve 1540 are sequentially installed from an upstream end to supply an inert gas into the housing 1410 at a predetermined flow rate.

An inert gas supply unit 1500 in the vacuum transfer chamber 1400 mainly includes the inert gas supply pipe 1510, the mass flow controller 1530 and the valve 1540. Also, the inert gas source 1520 and the inert gas supply hole 1460 may be included in the inert gas supply unit 1500.

An exhaust hole 1470 that exhausts the atmosphere of the housing 1410 is installed at a bottom wall of the housing 1410. An exhaust pipe 1610 is installed in the exhaust hole 1470. In the exhaust pipe 1610, an auto pressure controller (APC) 1620 which is a pressure controller and a pump 1630 are sequentially installed from an upstream end.

A gas exhaust unit 1600 in the vacuum transfer chamber 1400 mainly includes the exhaust pipe 1610 and the APC 1620. Also, the pump 1630 and the exhaust hole 1470 may be included in the gas exhaust unit 1600.

The atmosphere of the vacuum transfer chamber 1400 is controlled by the collaboration of the inert gas supply unit 1500 and the gas exhaust unit 1600. For example, an inner pressure of the housing 1410 is controlled.

As illustrated in FIG. 1, the process modules 110a, 110b, 110c and 110d that perform desired processes on the wafers 200 are connected to the sidewalls on which the load lock chamber 1300 is not installed among the five sidewalls of the housing 1410.

Chambers 100 are installed in each of the process modules 110a, 110b, 110c and 110d. Specifically, chambers 100a and 100b are installed in the process module 110a. Chambers 100c and 100d are installed in the process module 110b. Chambers 100e and 100f are installed in the process module 110c. Chambers 100g and 100h are installed in the process module 110d. Also, preferably, an even number of chambers are installed in each of the process modules.

Substrate loading and unloading ports 1480 are installed at the sidewalls facing the chambers 100 among the sidewalls of the housing 1410. For example, as illustrated in FIG. 2, a substrate loading and unloading port 1480e is installed at a sidewall facing the chamber 100e.

In FIG. 2, when the chamber 100e is replaced by the chamber 100a, a substrate loading and unloading port 1480a is installed at a sidewall facing the chamber 100a.

In the same manner, when the chamber 100e is replaced by the chamber 100b, a substrate loading and unloading port 1480b is installed at a sidewall facing the chamber 100b.

As illustrated in FIG. 1, gate valves 1490 are installed in each of process chambers. Specifically, a gate valve 1490a is installed between the chamber 100a and the vacuum transfer chamber 1400 and a gate valve 1490b is installed between the chamber 100b and the vacuum transfer chamber 1400. A gate valve 1490c is installed between the chamber 100c and the vacuum transfer chamber 1400 and a gate valve 1490d is installed between the chamber 100d and the vacuum transfer chamber 1400. A gate valve 1490e is installed between the chamber 100e and the vacuum transfer chamber 1400 and a gate valve 1490f is installed between the chamber 100f and the vacuum transfer chamber 1400. A gate valve 1490g is installed between the chamber 100g and the vacuum transfer chamber 1400 and a gate valve 1490h is installed between the chamber 100h and the vacuum transfer chamber 1400.

When each of the gate valves 1490 is opened or closed, the wafer 200 may be loaded or unloaded through the substrate loading and unloading port 1480.

Next, the vacuum transfer robot 1700 mounted in the vacuum transfer chamber 1400 will be described with reference to FIG. 3. FIG. 3 is an enlarged view of the vacuum transfer robot 1700 of FIG. 1.

The vacuum transfer robot 1700 includes two arms including the arm 1800 and the arm 1900. The arm 1800 includes a fork portion 1830 with two end effectors including an end effector 1810 and an end effector 1820 installed at tips thereof. A middle portion 1840 is connected to a center of the fork portion 1830 through a shaft 1850.

The wafers 200 unloaded from each of the process modules 110 are placed on the end effector 1810 and the end effector 1820. In FIG. 2, an example in which the wafer 200 unloaded from the process module 110c is placed thereon is illustrated.

A bottom portion 1860 is connected to a portion opposite to the fork portion 1830 among portions of the middle portion 1840 through a shaft 1870. The bottom portion 1860 is disposed on the flange 1430 through a shaft 1880.

The arm 1900 includes a fork portion 1930 with two end effectors including an end effector 1910 and an end effector 1920 installed at tips thereof. A middle portion 1940 is connected to a center of the fork portion 1930 through a shaft 1950.

The wafers 200 unloaded from the load lock chamber 1300 are placed on the end effector 1910 and the end effector 1920.

A bottom portion 1960 is connected to a portion opposite to the fork portion 1930 among portions of the middle portion 1940 through a shaft 1970. The bottom portion 1960 is disposed on the flange 1430 through a shaft 1980.

The end effector 1810 and the end effector 1820 are disposed at a higher level than the end effector 1910 and the end effector 1920.

The vacuum transfer robot 1700 may rotate based on the shafts and extend the arms.

Also, the vacuum transfer robot 1700 is configured to transfer the substrate which is transferred to the first placement surface 1311a to a chamber (ch1) 100a, a chamber (ch3) 100c, a chamber (ch5) 100e and a chamber (ch7) 100g, and the substrate which is transferred to the second placement surface 1311b to a chamber (ch2) 100b, a chamber (ch4) 100d, a chamber (ch6) 100f and a chamber (ch8) 100h.

(Process Modules (PM))

Next, the process module 110a among the process modules (process units) 110 will be described with reference to FIGS. 1, 2 and 4 as an example. FIG. 4 is an explanatory diagram for describing the process module 110a, a gas supply unit connected to the process module 110a and a gas exhaust unit connected to the process module 110a.

Here, although the process module 110a is used as an example, the other process modules including the process module 110b, the process module 110c and the process module 110d have the same structure, and thus descriptions thereof will be omitted herein.

As illustrated in FIG. 4, two chambers in which the wafer 200 is processed are installed in the process module 110a. Here, the chamber 100a and the chamber 100b are installed. A partition 2040a is installed between the chamber 100a and the chamber 100b and is configured so that the atmospheres in the chambers are not mixed.

As illustrated in FIG. 2, a substrate loading and unloading port 2060e is installed at a wall adjacent to the chamber 100e and the vacuum transfer chamber 1400, and in the same manner, a substrate loading and unloading port 2060a is installed at a wall adjacent to the chamber 100a and the vacuum transfer chamber 1400.

A substrate support unit 210 that supports the wafer 200 is installed in each chamber 100.

A gas supply unit that supplies a process gas into each of the chamber 100a and the chamber 100b is connected to the process module 110a. The gas supply unit includes a first gas supply unit (process gas supply unit), a second gas supply unit (reactive gas supply unit), a third gas supply unit (first purge gas supply unit) and a fourth gas supply unit (second purge gas supply unit). Each component of the gas supply unit will be described.

(First gas supply unit)

As illustrated in FIG. 4, a buffer tank 114, MFCs 115a and 115b and process chamber side valves 116 (116a and 116b) are installed between a process gas source 113 and the process module 110a. Also, these components are connected to each other through a process gas common pipe 112 or process gas supply pipes 111a and 111b. The first gas supply unit includes the process gas common pipe 112, the MFCs 115a and 115b, the process chamber side valves 116 (116a and 116b) and the first gas supply pipes (process gas supply pipes) 111a and 111b. Also, the process gas source 113 may be included in the first gas supply unit. Also, the same component may be added or removed according to the number of the process modules installed in the substrate processing system.

Here, the MFC may be a flow control device configured to combine the electrical flow meter and the flow control and a flow control device such as a needle valve, orifice or the like. The MFC to be described below may be configured in the same manner. When the MFC includes the flow control device such as a needle valve, orifice or the like, the gas supply is easily switched at a high speed in a pulsed manner.

(Second Gas Supply Unit)

As illustrated in FIG. 4, a remote plasma unit (RPU) 124 serving as an activation unit, MFCs 125a and 125b and process chamber side valves 126 (126a and 126b) are installed between a reactive gas supply source 123 and the process module 110a. These components are connected to each other through a reactive gas common pipe 122 or second gas supply pipes (reactive gas supply pipes) 121a and 121b. The second gas supply unit includes the RPU 124, the MFCs 125a and 125b, the process chamber side valves 126 (126a and 126b), the reactive gas common pipe 122 and the reactive gas supply pipes 121a and 121b. Also, the reactive gas supply source 123 may be included in the second gas supply unit. Also, the same component may be added or removed according to the number of the process modules installed in the substrate processing system.

Also, vent lines 171a and 171b and vent valves 170 (170a and 170b) may be installed in front of the process chamber side valves 126 (126a and 126b) and may be configured to exhaust a reactive gas. When the vent lines are installed, a deactivated reactive gas or a reactive gas having reduced reactivity may be discharged without passing the process chamber.

<Third Gas Supply Unit (First Purge Gas Supply Unit)>

As illustrated in FIG. 4, MFCs 135a and 135b, process chamber side valves 136 (136a and 136b) and valves 176a, 176b, 186a and 186b are installed between a first purge gas (inert gas) source 133 and the process module 110a. These components are connected to each other through a purge gas (inert gas) common pipe 132 or purge gas (inert gas) supply pipes 131a and 131b. The third gas supply unit includes the MFCs 135a and 135b, the process chamber side valves 136 (136a and 136b), the inert gas common pipe 132 and the inert gas supply pipes 131a and 131 b. Also, the purge gas (the inert gas) source 133 may be included in the third gas supply unit (first purge gas supply unit). Also, the same component may be added or removed according to the number of the process modules installed in the substrate processing system.

<Fourth Gas Supply Unit (Second Purge Gas Supply Unit)>

As illustrated in FIG. 4, the fourth gas supply unit is configured to supply an inert gas to the process chambers 110a and 110b through the process gas supply pipes 111a and 111b and the reactive gas supply pipes 121a and 121b. Second purge gas supply pipes 141a, 141b, 151a and 151b, MFCs 145a, 145b, 155a and 155b and valves 146a, 146b, 156a and 156b are installed between a second purge gas (the inert gas) source 143 and the supply pipes. The fourth gas supply unit (second purge gas supply unit) includes these components. Also, although the gas sources of the third gas supply unit and the fourth gas supply unit are separately configured here, only one integrated gas source may be installed.

Also, a gas exhaust unit that exhausts the atmospheres in the chamber 100a and the chamber 100b is connected to the process module 110a. As illustrated in FIG. 4, an APC 222a, a common gas exhaust pipe 225a and process chamber exhaust pipes 224a and 224b are installed between an exhaust pump 223a and the chambers 100a and 100b. The gas exhaust unit includes the APC 222a, the supply gas exhaust pipe 225a and the process chamber exhaust pipes 224a and 224b. The atmospheres in the chamber 100a and the chamber 100b are configured to be exhausted by a single exhaust pump. Also, conductance adjusters 226a and 226b that adjust exhaustion conductance of each of the process chamber exhaust pipes 224a and 224b may be installed and may be configured as components of the gas exhaust unit. Also, the exhaust pump 223a may be configured as a component of the gas exhaust unit.

Next, the chamber 100 according to the present embodiment will be described. The chamber 100 is configured as a single substrate processing apparatus as illustrated in FIG. 5. One process of manufacturing the semiconductor device is performed in the chamber 100. Also, the chambers 100a, 100b, 100c, 100d, 100e, 100f, 100g and 100h are configured to have the same configuration as illustrated in FIG. 5. Here, the chamber 100a will be described as an example.

As illustrated in FIG. 5, the chamber 100 includes a process container 202. The process container 202 has, for example, a circular cross-section and is configured as a planar closed container. Also, the process container 202 is made of a metal material such as aluminum (Al) or stainless steel (SUS) or quartz. A process space (process chamber) 201 and a transfer space 203 in which the wafer 200 such as a silicon wafer serving as a substrate is processed are formed in the process container 202. The process container 202 includes an upper container 202a and a lower container 202b. A partition plate 204 is installed between the upper container 202a and the lower container 202b. A space which is surrounded by the upper container 202a and located above the partition plate 204 is referred to as the process space (process chamber) 201 and a space that is surrounded by the lower container 202b and located under the partition plate 204 is referred to as the transfer space 203.

The substrate loading and unloading port 1480 adjacent to the gate valve 1490 is installed on a side surface of the lower container 202b and the wafer 200 moves between the substrate loading and unloading port 1480 and a transfer chamber (not illustrated) through the substrate loading and unloading port 1480. A plurality of lift pins 207 are installed on a bottom portion of the lower container 202b. Also, the lower container 202b is grounded.

The substrate support unit 210 that supports the wafer 200 is installed in the process chamber 201. The substrate support unit 210 includes a placement surface 211 on which the wafer 200 is placed and a substrate placement unit 212 having the placement surface 211 on a surface thereof. Also, a heater 213 serving as a heating unit may be installed in the substrate support unit 210. When the heating unit is installed, the substrate is heated, and thus the quality of a film formed on the substrate may be improved. Through holes 214 through which the lift pins 207 pass may be installed in the substrate placement unit 212 at positions corresponding to the lift pins 207.

The substrate placement unit 212 is supported by a shaft 217. The shaft 217 passes through a bottom portion of the process container 202 and is connected to a lifting mechanism 218 outside the process container 202. When the shaft 217 and the substrate placement unit 212 are lifted by operating the lifting mechanism 218, the wafer 200 placed on the substrate placement surface 211 may be lifted. Also, the vicinity of a lower end of the shaft 217 is covered by bellows 219, and thus the process chamber 201 is kept airtight.

When the wafer 200 is transferred, the substrate placement unit 212 is lowered until the substrate placement surface 211 is moved to a position (wafer transfer position) of the substrate loading and unloading port 1480, and when the wafer 200 is processed, the substrate placement unit 212 is lifted until the wafer 200 is moved to a position (wafer process position) of the process chamber 201 as illustrated in FIG. 5.

Specifically, when the substrate placement unit 212 is lowered to the wafer transfer position, an upper end of the lift pin 207 protrudes from an upper surface of the substrate placement surface 211, and thus the lift pin 207 is configured to support the wafer 200 from below. Also, when the substrate placement unit 212 is lifted to the wafer process position, the lift pin 207 is buried from the upper surface of the substrate placement surface 211, and thus the substrate placement surface 211 is configured to support the wafer 200 from below.

Also, since the lift pin 207 is directly in contact with the wafer 200, the lift pin 207 is preferably formed of a material such as quartz, alumina or the like. Also, the lift mechanism is installed in the lift pin 207, and thus the substrate placement unit 212 and the lift pin 207 may be configured to move relative to each other.

(Exhaust System)

An exhaust port 221 serving as a first exhaust unit that exhausts the atmosphere of the process chamber 201 is installed on an inner wall of the process chamber 201 [upper container 202a]. A process chamber exhaust pipe 224 is connected to the exhaust port 221 and a valve 227 is sequentially connected thereto in series. The first exhaust unit (exhaust line) mainly includes the exhaust port 221 and the process chamber exhaust pipe 224. Also, the valve 227 may be included in the first exhaust unit.

(Gas Inlet)

A first gas inlet 241a for supplying various gases into the process chamber 201 is installed at a sidewall of the upper container 202a. The first gas supply pipe 111a is connected to the first gas inlet 241a. Also, a second gas inlet 241b for supplying various gases into the process chamber 201 is installed on an upper surface (ceiling wall) of a shower head 234 installed on an upper portion of the process chamber 201. The second gas supply pipe 121b is connected to the second gas inlet 241b. A configuration of each of gas supply units connected to the first gas inlet 241a configured as a portion of the first gas supply unit and the second gas inlet 241b configured as a portion of the second gas supply unit will be described below. Also, the first gas inlet 241a into which a first gas is supplied is installed on the upper surface (ceiling wall) of the shower head 234 and thus the first gas may be supplied through a center of a first buffer space 232a. When the first gas is supplied through the center of the first buffer space 232a, the gas in the first buffer space 232a flows from a center thereof toward an outer circumference thereof, the gas in the space flows uniformly, and thus an amount of gas supplied to the wafer 200 may be kept uniform.

(Gas Distribution Unit)

The shower head 234 includes the first buffer chamber (space) 232a, first distribution holes 234a, a second buffer chamber (space) 232b and second distribution holes 234b. The shower head 234 is installed between the second gas inlet 241b and the process chamber 201. The first gas introduced through the first gas inlet 241a is supplied into the first buffer space 232a (first distribution unit) of the shower head 234. Also, the second gas inlet 241b is connected to a cover 231 of the shower head 234, and a second gas introduced through the second gas inlet 241b is supplied into the second buffer space 232b (second distribution unit) of the shower head 234 through a hole 231a installed in the cover 231. The shower head 234 is formed of a material such as quartz, alumina, stainless steel, aluminum or the like.

Also, the cover 231 of the shower head 234 is formed of a conductive metal and may be used as an activation unit (excitation unit) for exciting a gas in the first buffer space 232a, the second buffer space 232b or the process chamber 201. In this case, an insulating block 233 is installed between the cover 231 and the upper container 202a, and thus the cover 231 is insulated from the upper container 202a. A matching unit 251 and a high frequency power source 252 are connected to an electrode [cover 231] serving as the activation unit and the electrode [cover 231] may be configured to supply electromagnetic waves (radio frequency power or microwaves).

A gas guide 235 that forms the flow of the second gas supplied to the second buffer space 232b may be installed. The gas guide 235 has a conical shape in which a diameter thereof is increased toward a direction of a diameter of the wafer 200 about the hole 231a. A horizontal diameter of a lower end of the gas guide 235 is formed to extend further toward an outer circumference than ends of the first distribution hole 234a and the second distribution hole 234b.

A shower head exhaust port 240a serving as a first shower head exhaust unit that exhausts the atmosphere of the first buffer space 232a is installed on an upper surface of an inner wall of the first buffer space 232a. A shower head exhaust pipe 236 is connected to the shower head exhaust port 240a, and a valve 237x and a valve 237 that controls the inside of the first buffer space 232a to a predetermined pressure are sequentially connected to the shower head exhaust pipe 236 in series. The first shower head exhaust unit mainly includes the shower head exhaust port 240a, the valve 237x and the shower head exhaust pipe 236.

A shower head exhaust port 240b serving as a second shower head exhaust unit that exhausts the atmosphere of the second buffer space 232b is installed on an upper surface of an inner wall of the second buffer space 232b. The shower head exhaust pipe 236 is connected to the shower head exhaust port 240b, and a valve 237y and the valve 237 that controls the inside of the second buffer space 232b to a predetermined pressure are sequentially connected to the shower head exhaust pipe 236 in series. The second shower head exhaust unit mainly includes the shower head exhaust port 240b, the valve 237y and the shower head exhaust pipe 236.

Next, a relationship between the first buffer space 232a serving as the first gas supply unit and the second buffer space 232b serving as the second gas supply unit will be described. A plurality of distribution holes 234a extend from the first buffer space 232a to the process chamber 201. A plurality of distribution holes 234b extend from the second buffer space 232b to the process chamber 201. The second buffer space 232b is installed above the first buffer space 232a. Thus, as illustrated in FIG. 5, the distribution holes (distribution pipes) 234b extend to the process chamber 201 to pass through the first buffer space 232a from the second buffer space 232b.

(Supply System)

A gas supply unit is connected to a gas introducing hole 241 connected to the cover 231 of the shower head 234. A process gas, a reactive gas and a purge gas are supplied through the gas supply unit.

(Control Unit)

As illustrated in FIG. 5, the chamber 100 includes a controller 260 that controls operations of each unit of the chamber 100.

Figure 6:
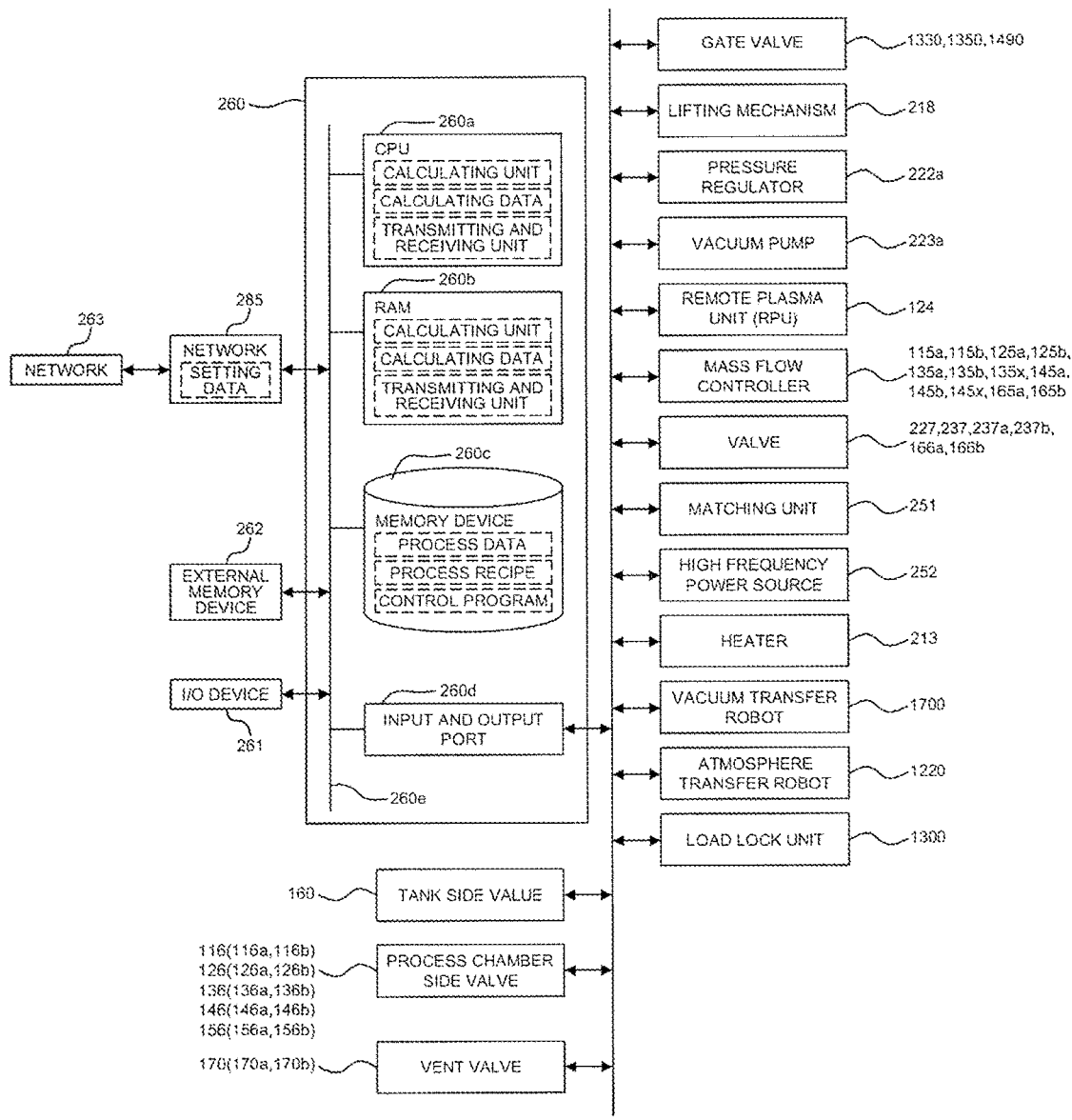
FIG. 6 is a configuration diagram schematically illustrating a controller of the substrate processing system according to an embodiment of the present invention.

The controller 260 is schematically illustrated in FIG. 6. The controller 260 serving as a control unit (control device) is configured as a computer that includes a central processing unit (CPU) 260a, a random access memory (RAM) 260b, a memory device 260c and an I/O port 260d. The RAM 260b, the memory device 260c and the I/O port 260d are configured to exchange data with the CPU 260a through an internal bus 260e. An I/O device 261 configured as, for example, a touch panel, an external memory device 262, a receiving unit 285 or the like is configured to be connected to the controller 260.

The memory device 260c is configured as, for example, a flash memory, a hard disk drive (HDD) and the like. A control program controlling operations of the substrate processing apparatus, a process recipe describing sequences or conditions of substrate processing to be described below, process data used in a calculation process in which the process recipe sets to the substrate 200 or the like are readably stored in the memory device 260c. Also, the process recipe, which is a combination of sequences, causes the controller 260 to execute each sequence in a substrate processing process to be described below in order to obtain a predetermined result, and functions as a program. Hereinafter, such a program recipe, a control program and the like are collectively simply called a "program." Also, when the term "program" is used in this specification, it may refer to either or both of the program recipe and the control program. Also, the RAM 260b is configured as a memory area (work area) in which a program, calculating data, process data and the like read by the CPU 260a are temporarily retained.

The I/O port 260d is connected to the gate valves 1330, 1350 and 1490, the lifting mechanism 218, the heater 213, pressure adjusters 222 and 238, the vacuum pump 223, the matching unit 251, the high frequency power source 252 and the like. Also, the I/O port 260d may be connected to an atmosphere transfer unit 1220, a vacuum transfer robot 1700, a load lock chamber 1300, MFCs [115 (115a and 115b), 125 (125a, 125b and 125x), 135 (135a, 135b and 135x), 145 (145a, 145b and 145x), 155 (155a and 155b) and 165 (165a and 165b)], valves 237 (237e and 237f), process chamber side valves [116 (116a and 116b), 126 (126a and 126b), 136 (136a and 136b), 176 (176a and 176b) and 186 (186a and 186b)], a tank side valve 160, vent valves 170 (170a and 170b), the RPU 124 and the like to be described below.

The CPU 260a serving as a calculating unit is configured to read and execute the control program from the memory device 260c and read the process recipe from the memory device 260c according to an input of a manipulating command from the I/O device 261. Also, the process recipe or the control data stored in the memory device 260c is compared and calculated to a set value input from the receiving unit 285 and calculating data is obtained. Also, in this configuration, the determination of the process data (process recipe) corresponding to the calculating data can be performed. Also, to comply with the content of the read process recipe, the CPU 260a is configured to control an open or close operation of a gate valve 1330, 1350 and 1490 (1490a, 1490b, 1490c, 1490d, 1490e, 1490f, 1490g and 1490h), a lifting operation of the lifting mechanism 218, a power supply operation to the heater 213, a pressure adjusting operation by the pressure adjusters [222 (222a) and 238], ON/OFF control by the vacuum pump 223, a gas activation operation of the RPU 124, a flow rate adjusting operation by the MFCs [115 (115a and 115b), 125 (125a and 125b) and 135 (135a and 135b)], ON/OFF control of the gas by the valves 237 (237e and 237f), the process chamber side valves [116 (116a and 116b), 126 (126a, 126b, 126c and 126d), 136 (136a and 136b), 176 (176a and 176b) and 186 (186a and 186b)], the tank side valve 160 and the vent valves 170 (170a and 170b), a matching operation of the power by the matching unit 251, ON/OFF control of the high frequency power source 252 and the like.

Also, the controller 260 is not limited to being configured as a dedicated computer, but may be configured as a general-purpose computer. For example, the controller 260 according to the present embodiment may be configured by preparing an external memory device 262 [for example, a magnetic tape, a magnetic disk such as a flexible disk or a hard disk, an optical disc such as a CD or a DVD, a magneto-optical disc such as an MO or a semiconductor memory such as a USB memory or a memory card] recording the above-described program and then installing the program in the general-purpose computer using the external memory device 262. Also, a method of supplying the program to the computer is not limited to supply through the external memory device 262. For example, a communication line such as a network 263 (the Internet or a dedicated line) may be used to supply the program through the receiving unit 285 without the external memory device 262. Also, the memory device 260c or the external memory device 262 is configured as a non-transitory computer-readable recording medium. Hereinafter, these are also collectively simply called a recording medium. Also, when the term "recording medium" is used in this specification, it refers to either or both of the memory device 260c and the external memory device 262.

(2) First Substrate Processing Process

Next, sequences of forming an insulating film, for example, a silicon oxide (SiO) film serving as a silicon-containing film, on a substrate using a processing furnace of the above-described substrate processing apparatus will be described with reference to FIGS. 7 and 8 as a method of manufacturing the semiconductor apparatus (semiconductor device). Also, in the following description, operations of each unit of the substrate processing apparatus are controlled by the controller 260.

When the term "wafer" is used in this specification, it refers to "the wafer itself," or a "laminate (aggregate) of a wafer and a predetermined layer, film and the like formed on a surface thereof," that is, the wafer refers to a wafer including a predetermined layer, film and the like formed on a surface thereof. In addition, when the term "surface of the wafer" is used in this specification, it refers to "a surface (exposed surface) of the wafer itself" or "a surface of a predetermined layer, film and the like formed on the wafer, that is, the outermost surface of the wafer laminate."

Therefore, when it is described in this specification that "a predetermined gas is supplied to the wafer," it means that "a predetermined gas is directly supplied to a surface (exposed surface) of the wafer itself" or "a predetermined gas is supplied to a layer, film and the like formed on the wafer, that is, to the outermost surface of the wafer laminate." In addition, when it is described in this specification that "a predetermined layer (or film) is formed on the wafer," it means that "a predetermined layer (or film) is directly formed on a surface (exposed surface) of the wafer itself" or "a predetermined layer (or film) is formed on a layer, film and the like formed on the wafer, that is, a predetermined layer (or film) is formed on the outermost surface of the wafer laminate."

Also, the terms "substrate" and "wafer" as used in this specification have the same meanings. Thus, the term "wafer" in the above description may be replaced with the term "substrate."

Hereinafter, a first substrate processing process (S200A) will be described.

<Substrate Loading Process (S201)>

In the first substrate processing process (S200A), first, the wafer 200 is loaded into the process chamber 201. Specifically, the substrate support unit 210 is lowered by the lifting mechanism 218 and the lift pin 207 protrudes from an upper surface of the substrate support unit 210 through the through hole 214. Also, after an inner pressure of the process chamber 201 is adjusted to have a predetermined pressure, the gate valve 1490 is opened and then the wafer 200 is placed on the lift pin 207 through the gate valve 1490. After the wafer 200 is placed on the lift pin 207, when the substrate support unit 210 is lifted by the lifting mechanism 218 to a predetermined position, the wafer 200 is placed on the substrate support unit 210 from the lift pin 207.

<Pressure Reducing and Temperature Rising Process (S202)>

Next, the process chamber 201 is exhausted through the process chamber exhaust pipe 224 so that the process chamber 201 has a predetermined pressure (degree of vacuum). In this case, a degree of opening of the APC valve serving as the pressure adjuster 222 (222a) is fed back and controlled based on a pressure value measured by a pressure sensor. Also, an amount of power supply of the heater 213 is fed back and controlled so that the process chamber 201 has a predetermined temperature based on a temperature value measured by a temperature sensor (not illustrated). Specifically, the substrate support unit 210 is pre-heated by the heater 213, and then the substrate support unit 210 is left for a predetermined time when a change of a temperature of the wafer 200 or the substrate support unit 210 stops. During that time, when there is remaining moisture in the process chamber 201 or a gas discharged from the component, the remaining moisture or the gas may be vacuum-exhausted or removed by purging by the supply of $N_2$ gas. Through this, the preparation before the film forming process is completed. Also, when the process chamber 201 is exhausted to a predetermined pressure, the process chamber 201 may be vacuum-exhausted to a degree of vacuum that can be reached in one process.

<First Film Forming Process (S301A)>

Next, an example in which a SiO film is formed on the wafer 200 will be described. The first film forming process (S301A) will be described in detail with reference to FIGS. 7 and 8.

Figure 7:
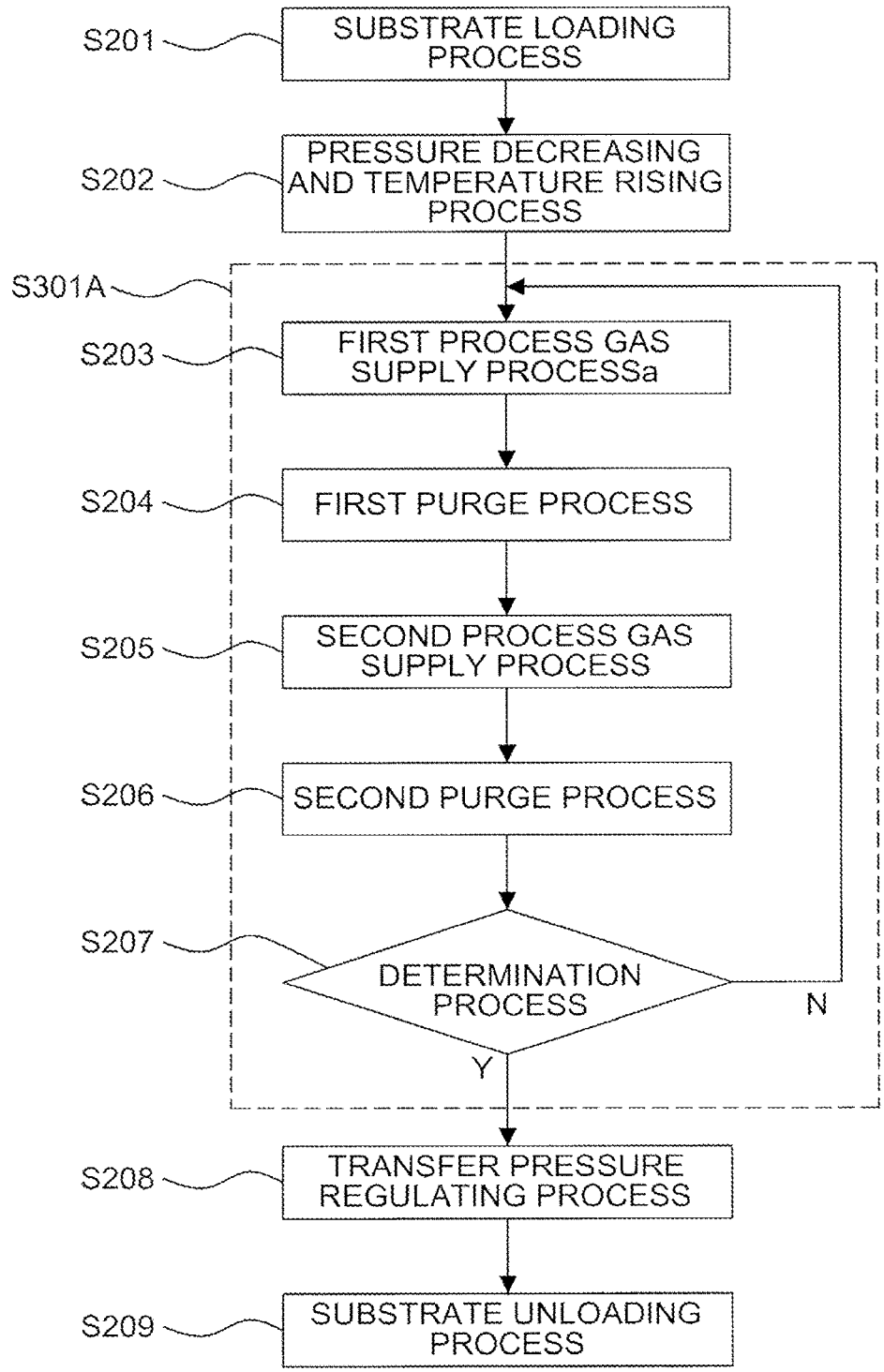
FIG. 7 is a flowchart for describing a first substrate processing process according to an embodiment of the present invention.
Figure 8:
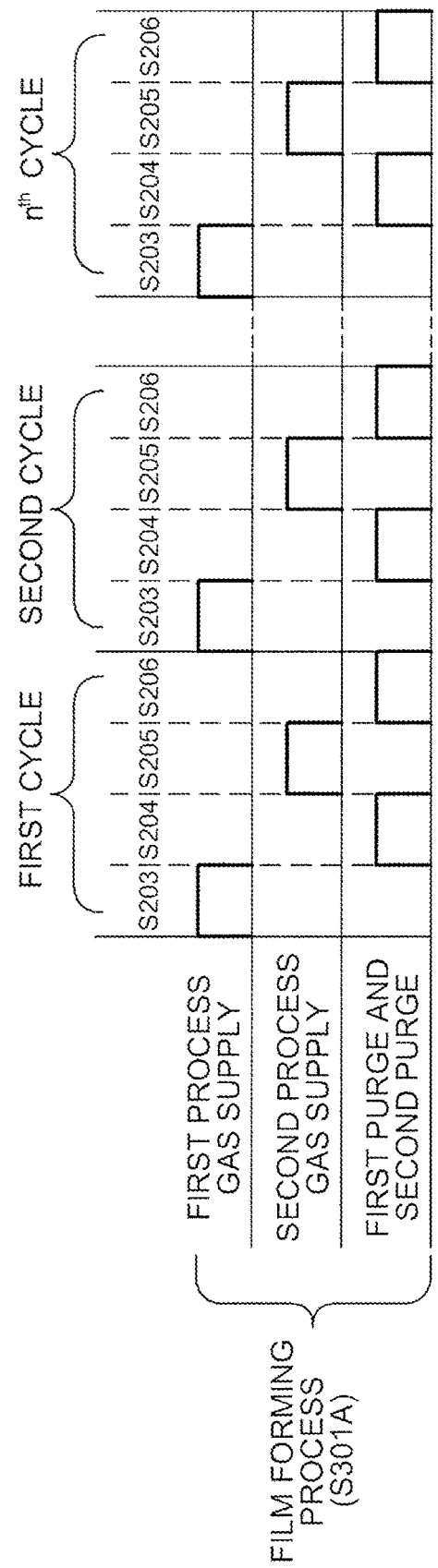
FIG. 8 is a sequence diagram for describing the first substrate processing process according to an embodiment of the present invention.

After the wafer 200 is placed on the substrate support unit 210 and the atmosphere in the process chamber 201 is stabilized, processes S203 through S207 illustrated in FIGS. 7 and 8 are performed.

<First Gas Supply Process (S203)>

In the first gas supply process (S203), the first gas supply unit supplies an aminosilane-based gas serving as a first gas (source gas) into the process chamber 201. The aminosilane-based gas includes, for example, bis(diethylamino)silane (BDEAS) ($H_2Si(NEt_2)_2$). Specifically, the gas valve 160 is opened and the aminosilane-based gas is supplied from the gas source to the chamber 100. In this case, the process chamber side valve 116a is opened and the aminosilane-based gas is adjusted to a predetermined flow rate by the MFC 115a. The aminosilane-based gas having the adjusted flow rate passes through the first buffer space 232a and is supplied into the process chamber 201 in a reduced pressure state through the gas supply hole 234a of the shower head 234. Also, the process chamber 201 is continuously exhausted by the exhaust system and the inner pressure of the process chamber 201 is controlled to be within a predetermined pressure range (first pressure). In this case, when the aminosilane-based gas is supplied to the wafer 200, the aminosilane-based gas is supplied into the process chamber 201 at a predetermined pressure (first pressure, for example, in a range of 100 Pa to 20,000 Pa). In the same manner, the aminosilane-based gas is supplied to the wafer 200. When the aminosilane-based gas is supplied, a silicon-containing layer is formed on the wafer 200.

<First Purge Process (S204)>

After the silicon-containing layer is formed on the wafer 200, the gas valve 116a of the first gas supply pipe 111a is closed and the supply of the aminosilane-based gas is stopped. By stopping the supply of the source gas and exhausting the source gas in the process chamber 201 or the source gas in the first buffer space 232a through the process chamber exhaust pipe 224, the first purge process (S204) is performed.

Also, in the purge process, a configuration in which a discharging process in which an inert gas is supplied and the residual gas is extruded in addition to the discharge of the gas by simply exhausting (vacuum suction) the gas is performed is possible. Also, a combination of the vacuum suction and the supply of the inert gas may be performed. Also, the vacuum suction and the supply of the inert gas may be alternately performed.

Also, in this case, the valve 237 of the shower head exhaust pipe 236 is opened and the gas in the first buffer space 232a may be exhausted through the shower head exhaust pipe 236. Also, during the exhaustion, inner pressures (exhaustion conductance) of the shower head exhaust pipe 236 and the first buffer space 232a are controlled by the valve 227 and the valve 237. The valve 227 and the valve 237 may be controlled so that the exhaustion conductance from the shower head exhaust pipe 236 in the first buffer space 232a is greater than the exhaustion conductance to the process chamber exhaust pipe 224 through the process chamber 201. When the exhaustion conductance is controlled, a gas flow from the first gas inlet 241a which is an end of the first buffer space 232a toward the shower head exhaust port 240a which is another end thereof is formed. When the gas flow is formed, a gas attached to a wall of the first buffer space 232a or a gas floating in the first buffer space 232a is exhausted through the shower head exhaust pipe 236 without entering the process chamber 201. Also, an inner pressure of the first buffer space 232a and an inner pressure (exhaustion conductance) of the process chamber 201 may be adjusted to suppress a backflow of the gas from the process chamber 201 to the first buffer space 232a.

Also, in the first purge process, the vacuum pump 223 continuously operates and the gas in the process chamber 201 is exhausted through the vacuum pump 223. Also, the valve 227 and the valve 237 may be adjusted so that the exhaustion conductance from the process chamber 201 to the process chamber exhaust pipe 224 is greater than the exhaustion conductance to the first buffer space 232a. When the valve 227 and the valve 237 are adjusted, the gas flow toward the process chamber exhaust pipe 224 via the process chamber 201 is formed and the residual gas in the process chamber 201 may be exhausted. Also, here, when the valve 136a is opened, the MFC 135a is adjusted and the inert gas is supplied, the inert gas may be reliably supplied onto the substrate, and thus the removal efficiency of the residual gas on the substrate may be improved.

After a predetermined time has elapsed, the valve 136a is closed and the supply of the inert gas is stopped, and at the same time, the valve 237 is closed and a flow path from the first buffer space 232a to the shower head exhaust pipe 236 is blocked.

More preferably, after the predetermined time, the valve 237 is closed while the vacuum pump 223 continuously operates. In this manner, since the flow toward the process chamber exhaust pipe 224 via the process chamber 201 is not affected by the shower head exhaust pipe 236, it is possible to more reliably supply the inert gas onto the substrate, and thus the removal efficiency of the residual gas on the substrate may be further improved.

Also, purging of the atmosphere from the process chamber refers to an extrusion operation of the gas by supplying the inert gas in addition to discharging the gas by simply vacuum suction. Therefore, in the first purge process, the inert gas is supplied into the first buffer space 232a and the discharging operation by the extrusion of the residual gas may be performed. Also, a combination of the vacuum suction and the supply of the inert gas may be performed. Also, the vacuum suction and the supply of the inert gas may be alternately performed.

Also, in this case, a high flow rate of $N_2$ gas supplied into the process chamber 201 is not necessary, and for example, an amount of the $N_2$ gas corresponding to the volume of the process chamber 201 may be supplied. When the purge process is performed in this manner, an effect on a subsequent process may be reduced. Also, when the process chamber 201 is partially purged, the purge time may be reduced and the manufacturing throughput may be improved. Also, it is possible to suppress the $N_2$ gas consumed to as little as necessary.

In this case, a temperature of the heater 213 is set to be the same as when the source gas is supplied to the wafer 200 within a range of 200° C. to 750° C., preferably, a predetermined temperature within a range of 300° C. to 600° C., and more preferably, within a range of 300° C. to 550° C. A supply flow rate of the $N_2$ gas serving as the purge gas supplied through each inert gas supply system is, for example, within a range of 100 sccm to 20,000 sccm. A rare gas such as Ar, He, Ne, Xe or the like may be used as the purge gas instead of the $N_2$ gas.

<Second Process Gas Supply Process (S205)>

After the first gas purge process, the valve 126 is opened and an oxygen-containing gas serving as a second gas (reactive gas) is supplied into the process chamber 201 through the gas introducing hole 241b, the second buffer space 232b and the plurality of distribution holes 234b. The oxygen-containing gas includes, for example, oxygen ($O_2$) gas, ozone ($O_3$) gas, water ($H_2O$), nitrous oxide ($N_2O$) gas or the like. Here, an example using $O_2$ gas is described. Since the $O_2$ gas is supplied into the process chamber 201 through the second buffer space 232b and the distribution hole 234b, the gas may be uniformly supplied onto the substrate. Therefore, a film thickness may be made uniform. Also, when the second gas is supplied, the second gas activated through the RPU 124 serving as an activation unit (excitation unit) may be supplied into the process chamber 201.

In this case, the MFC 125 adjusts a flow rate of the $O_2$ gas to a predetermined flow rate. Also, a supply flow rate of the $O_2$ gas is, for example, in a range of 100 sccm to 10,000 sccm. Also, when the pressure adjuster 238 is appropriately adjusted, an inner pressure of the second buffer space 232b is within a predetermined pressure range. Also, when the $O_2$ gas flows into the RPU 124, the RPU 124 is in an ON state (a state in which power is turned on) and is controlled so that the $O_2$ gas is activated (excited).

When the $O_2$ gas is supplied to a silicon-containing layer formed on the wafer 200, the silicon-containing layer is modified. For example, silicon atoms or a modified layer containing silicon atoms is formed. Also, when the RPU 124 is installed and the activated $O_2$ gas is supplied onto the wafer 200, a number of modified layers may be formed.

The modified layer is formed, for example, to have a predetermined thickness, a predetermined distribution and a predetermined penetration depth of an oxygen component with respect to the silicon-containing layer according to the inner pressure of the process chamber 201, the flow rate of the $O_2$ gas, the temperature of the wafer 200 and a power supply state of the RPU 124.

After a predetermined time has elapsed, the valve 126 is closed and the supply of the $O_2$ gas is stopped.

<Second Purge Process (S206)>

When the supply of the $O_2$ is stopped, the second purge process (S206) is performed by exhausting the $O_2$ gas in the process chamber 201 or the $O_2$ gas in the second buffer space 232b through the first exhaust unit. The second purge process (S206) is performed in the same manner as the above-described first purge process (S204).

In the second purge process (S206), the vacuum pump 223 continuously operates, and the gas in the process chamber 201 is exhausted through the process chamber exhaust pipe 224. Also, the valve 227 and the valve 237 may be adjusted so that the exhaustion conductance from the process chamber 201 to the process chamber exhaust pipe 224 is greater than the exhaustion conductance to the second buffer space 232b. When the valve 227 and the valve 237 are adjusted, a gas flow toward the process chamber exhaust pipe 224 via the process chamber 201 is formed and the residual gas in the process chamber 201 may be exhausted. Also, here, when the gas valve 136b is opened, the MFC 135b is adjusted and the inert gas is supplied, it is possible to reliably supply the inert gas onto the substrate, and thus the removal efficiency of the residual gas on the substrate may be improved.

After a predetermined time has elapsed, the gas valve 136b is closed and the supply of the inert gas is stopped, and at the same time, the valve 237b is closed and a space between the second buffer space 232b and the shower head exhaust pipe 236 is blocked.

More preferably, after a predetermined time has elapsed, the valve 237b is closed while the vacuum pump 223 continuously operates. With this configuration, since the flow toward the shower head exhaust pipe 236 via the process chamber 201 is not affected by the process chamber exhaust pipe 224, the inert gas may be reliably supplied onto the substrate, and thus the removal efficiency of the residual gas on the substrate may be further improved.

Also, purging the atmosphere from the process chamber refers to an extrusion operation of the gas by supplying the inert gas in addition to discharging the gas by simply vacuum suction. Therefore, in the purge process, the inert gas is supplied into the second buffer space 232b and the discharging operation by the extrusion of the residual gas may be performed. Also, a combination of the vacuum suction and the supply of the inert gas may be performed. Also, the vacuum suction and the supply of the inert gas may be alternately performed.

Also, in this case, a high flow rate of $N_2$ gas supplied into the process chamber 201 is unnecessary, and for example, an amount of $N_2$ gas corresponding to the volume of the process chamber 201 may be supplied. When the purge process is performed in this manner, an effect on the subsequent process may be reduced. Also, when the process chamber 201 is partially purged, the purge time may be reduced and thus the manufacturing throughput may be improved. Also, it is possible to suppress the $N_2$ gas consumed to as little as necessary.

In this case, a temperature of the heater 213 is set to be the same as when a source gas is supplied to the wafer 200 within a range of 200° C. to 750° C., preferably, a predetermined temperature within a range of 300° C. to 600° C., and more preferably, within a range of 300° C. to 550° C. A supply flow rate of $N_2$ gas serving as a purge gas supplied through each inert gas supply system is, for example, within a range of 100 sccm to 20,000 sccm. A rare gas such as Ar, He, Ne, Xe or the like may be used as the purge gas instead of the $N_2$ gas.

<Determination Process (S207)>

After the first purge process (S206) is completed, the controller 260 determines whether or not processes S203 through S206 in the film forming process (S301A) are performed a predetermined number n of cycles (where n is a natural number). That is, it is determined whether or not a film having a desired thickness is formed on the wafer 200. When the above-described processes S203 through S206 are referred to as one cycle and the cycle is performed at least once [Process S207], an insulating film containing silicon and oxygen, that is, a SiO film, may be formed on the wafer 200 to have a predetermined thickness. Also, preferably, the above-described cycle is repeated. Thus, the SiO film having the predetermined thickness is formed on the wafer 200.

When the predetermined number of cycles are not performed (when N is determined), the cycle of processes S203 through S206 is repeated. When the predetermined number of cycles are performed (when Y is determined), the film forming process (S301A) is completed and a transfer pressure adjusting process (S208) and a substrate unloading process (S209) are performed.

Also, in the above-described first gas supply process (S203) or the above-described second gas supply process (S205), when the first gas is supplied, the inert gas is supplied into the second buffer space 232b serving as a second distribution unit, and when the second gas is supplied, the inert gas is supplied into the first buffer space 232a serving as a first distribution unit. Thus, each gas may be prevented from flowing back into the other buffer space.

<Transfer Pressure Adjusting Process (S208)>

In the transfer pressure adjusting process (S208), the process chamber 201 or the transfer space 203 is exhausted through the process chamber exhaust pipe 224 so that an inner pressure of the process chamber 201 or the transfer space 203 is a predetermined pressure (degree of vacuum). In this case, the inner pressure of the process chamber 201 or the transfer space 203 is adjusted to an inner pressure of the vacuum transfer chamber 1400 or more. Also, a configuration in which the wafer 200 remains on the lift pin 207 during, before or after the transfer pressure adjusting process (S208) so that it is cooled to a predetermined temperature is possible.

<Substrate Unloading Process (S209)>

After the process chamber 201 has a predetermined pressure in the transfer pressure adjusting process (S208), the gate valve 1490 is opened and the wafer 200 is unloaded form the transfer space 203 into the vacuum transfer chamber 1400.

In this process, the processing is performed on the wafer 200.

Also, as illustrated in FIG. 1, even when a group including an odd number of wafers is transferred to the processing apparatus including an even number of chambers 100, the increase of productivity is required. A method of increasing the productivity includes, for example, increasing the processing number (processing throughput) of the wafers 200 per unit time, maintaining process performance, reducing the maintenance time, reducing the frequency of maintenance or the like. For example, when a lot including 25 wafers 200 is processed by the processing apparatus illustrated in FIG. 1, the first substrate processing process (S200A) [first film forming process (S301A)] is performed in one chamber of the process module for processing a last remaining wafer and a second substrate processing process (S200B) [second film forming process (S301B)] is performed in the other chamber. The inventors have found the following challenges A and B in processing a lot multiple times. Here, the group including the odd number of wafers includes a single pod 1001 or a plurality of pods 1001 in which the odd number of wafers 200 is stored.

Also, although the challenges A and B to be described below are remarkable when a lot including a group having about 21 to 25 wafers or a group having about 9 to 13 wafers is manufactured, the same challenges also occur when a lot including a group having about 14 to 20 wafers or a group having 25 wafers or more is manufactured.

(Challenge A)

As illustrated in FIG. 11, when one lot including 25 wafers is processed multiple times, the number of times a particular chamber is used may be increased. Here, an example in which a lot including 25 wafers is processed nine times is described. A difference between the number of times a chamber ch1 of a process module PM1 is processed and the number of times the other process module is processed is a maximum of nine. In this case, the probability of particles being generated or the maintenance timing in the chamber ch1 may be different from the probability of particles being generated or the maintenance timing in the other chambers (chamber ch2 to chamber ch8). Specifically, since the chamber ch1 and the chamber ch2 are installed in the same process module PM1 and share the gas supply unit, productivity is significantly reduced when the maintenance timing in the chamber ch1 is different from the maintenance timing in the chamber ch2.

(Challenge B)

A semiconductor device having a stack structure may be provided and one process is performed on the semiconductor device multiple times. When one process is performed multiple times, there is a case in which the same wafer 200 is processed in the same chamber. When the chambers have a difference (device difference) from each other, there is a challenge in that a characteristic of a semiconductor device formed on a particular wafer is different from a characteristic of a semiconductor device formed on another wafer. For example, a film characteristic in the chamber ch1 may be different from a film characteristic in the chamber ch3. Here, film characteristics include a film thickness, film quality, crystallinity, a dielectric constant, a refractive index, film density, an etching rate and the like.

For example, there is a process of forming an interlayer insulating film as an example in which one process is performed multiple times. The process of forming the interlayer insulating film is performed several times to several tens of times. In this case, the same processing apparatus may be used multiple times. For example, in FIG. 11, a first wafer and a fifth wafer may be the same wafer. Thus, specifically, the processing is often performed on the same substrate by the same processing apparatus in manufacture of a small number of lots including a small number of wafers. The other lot is not manufactured during a first process and next process, and the same lot as in the previous process may be processed.

The inventors have found that it is possible to address the above-described challenges by transferring the substrate in the following sequences a and b. That is, even when a group including an odd number of wafers is processed, productivity may be improved. Also, the inventors have found that it is possible to improve the processing uniformity in each wafer 200.

Also, the inventors have further conducted research on methods of addressing the challenges and have found the following challenge C in the sequences a and b.

(Challenge C)

The processing is performed on the first to $24^{th}$ wafers 200 in the same specific chamber, and a variation occurs in a characteristic of the film formed on the particular wafer 200.

Also, the challenge A, the challenge B, the challenge C occur easily when the number of the wafers 200 stored in a storage unit is not divisible by the number of process units or the number of chambers.

The inventors have found the following transfer sequence c as a transfer sequence for addressing the challenge C.

Sequence a

The challenge C may be addressed by first starting to transfer a next process unit of the process unit that processes a last wafer of the previous lot. For example, when the processing is performed on a lot including 25 wafers 200 multiple times, a process unit PMm in which a last remaining wafer 200 of an $x^{th}$ lot (where x is a natural number) is transferred is recorded in the control unit 260 and the atmosphere transfer robot 1220 serving as a first transfer robot and the vacuum transfer robot 1700 serving as a second transfer robot are controlled so that an $(m+1)^{th}$ process unit starts to be transferred first in an $(x+1)^{th}$ lot. The sequence a will be described with reference to FIG. 12 as an example. A numeral m of the process unit that processes a last, i.e., $25^{th}$, wafer of a lot 1 is recorded as 1 and a first wafer of a lot 2 starts to be transferred first to a process unit PM2 of which a numeral corresponds to m+1. Also, a numeral m of the process unit that processes the last, i.e., $25^{th}$, wafer of the lot 2 is recorded as 2 and a first wafer of a lot 3 starts to be transferred first to a process unit PM3 of which a numeral corresponds to m+1. That is, even when there is a remaining chamber in the process unit in which a last remaining wafer 200 of the lot is processed, the next lot skips the remaining chamber and starts to be transferred first to the next process unit. With this configuration, a difference between the numbers of times the chambers are used is compared to that in the transfer sequence of FIG. 11, a difference between a maximum value and a minimum value of a total usage count in each chamber is decreased and thus variation may be decreased. That is, it is possible to equalize the number of times each chamber is used.

Also, even in a lot including 13 wafers, it is possible to reduce the difference between the numbers of times the chambers are used. FIG. 13 illustrates the case of a lot including 13 wafers.

Sequence b

In addition to the transfer sequence a, the atmosphere transfer robot 1220 and the vacuum transfer robot 1700 are controlled so that a last remaining wafer 200 of an $x^{th}$ lot is transferred is recorded in the control unit 260 and a last remaining wafer 200 of an $(x+1)^{th}$ lot is transferred to an $(n+1)^{th}$ position. The sequence b will be described with reference to FIG. 14 as an example. A numeral m of the process unit that processes a last remaining, i.e., $25^{th}$, wafer of a lot 1 is recorded as 1 and a numeral n of the chamber that processes the $25^{th}$ wafer is also recorded as 1. Next, a first wafer of a lot 2 starts to be transferred first to a process unit PM2 of which a numeral corresponds to m+1 and the $25^{th}$ wafer is transferred in the chamber ch2 of which a numeral corresponds to n+1. Compared to the transfer sequence a, when the transferring is performed in this manner, a maximum value and a minimum value of a total usage count in each chamber are decreased and thus variation may be decreased. Also, it is possible to suppress the variation of the chamber using the $25^{th}$ wafer.

FIG. 15 illustrates the case of a lot including 13 wafers. As illustrated in FIG. 15, even in a lot including 13 wafers, it is possible to reduce the difference between the numbers of times the chambers are used.

Sequence c

In addition to either or both of the above-described transfer sequences a and b, it is possible to address the above-described challenges by controlling the atmosphere transfer robot 1220 serving as a first transfer robot so that an order of the transfer to the placement surface 131a and the placement surface 131b which are installed in the load lock chamber 1300 is alternately changed.

For example, a transfer sequence is configured as illustrated in FIG. 16. FIG. 16 shows a configuration in which a first wafer 200 is transferred to the placement surface 131a, a second wafer 200 is transferred to the placement surface 131b, a third wafer 200 is transferred to the placement surface 131b and a fourth wafer 200 is transferred to the placement surface 131a. Also, a fifth wafer 200 is placed on the placement surface 131a and a sixth wafer 200 is placed on the placement surface 131b. In the same manner, a first wafer is transferred to the chamber ch1, a second wafer is transferred to the chamber ch2, a third wafer is transferred to the chamber ch3, a fourth wafer is transferred to the chamber ch4, a fifth wafer is transferred to the chamber ch5 and a sixth wafer is transferred to the chamber ch6. In other words, in this configuration, the placement on the placement surface is switched, and transfer is performed according to the number of chambers in the processing unit. Also, in other words, the atmosphere transfer robot 1220 serving as a first transfer robot is controlled so that a $(4y-1)^{th}$ (where y is a natural number) (e.g., $3^{rd}$, $7^{th}$, $11^{th}$, $15^{th}$, $19^{th}$ and $23^{rd}$) substrate is transferred from the placement surface 131*b* in an odd-numbered $((2x-1)^{th})$ lot (where x is a natural number) and a $(4y-3)^{th}$ (e.g., $1^{st}$, $5^{th}$, $9^{th}$, $13^{th}$, $17^{th}$, $21^{st}$ and $25^{th}$) substrate is transferred from the placement surface 131*b* in an even-numbered $(2x)^{th}$ lot. Even when the process is performed on a lot including 25 wafers multiple times by controlling the transferring, the continuous use of all the first to $25^{th}$ wafers 200 in each chamber may be suppressed while a difference between the numbers of times the chambers are used is reduced.

Also, as illustrated in FIG. 17, even when each lot includes 13 wafers, it is possible to reduce the difference between the numbers of times the chambers are used.

Also, a $(4y-1)^{th}$ substrate may be transferred from the placement surface 131*b* in a $(2x)^{th}$ lot and a $(4y-3)^{th}$ substrate may be transferred from the placement surface 131*b* in a $(2x-1)^{th}$ lot.

Hereinafter, the second substrate processing process (S200B) performed in the chamber in which the wafer 200 in the above-described process module is not transferred will be described. In the following example, a case in which the substrate is transferred to the chamber 100*a* illustrated in FIG. 4 and the first substrate processing process (S200A) is performed in the chamber 100*a*, and the second substrate processing process (S200B) is performed in the chamber 100*b* in a state in which the substrate is not transferred to the chamber 100*b* will be described. When the second substrate processing process (S200B) is performed in the chamber in which the wafer 200 is not transferred, the exhaustion conductance of the chamber 100*a* and the chamber 100*b* of the process module illustrated in FIG. 4 may be constantly maintained and thus it is possible to improve the processing uniformity in each wafer 200.

Figure 9:
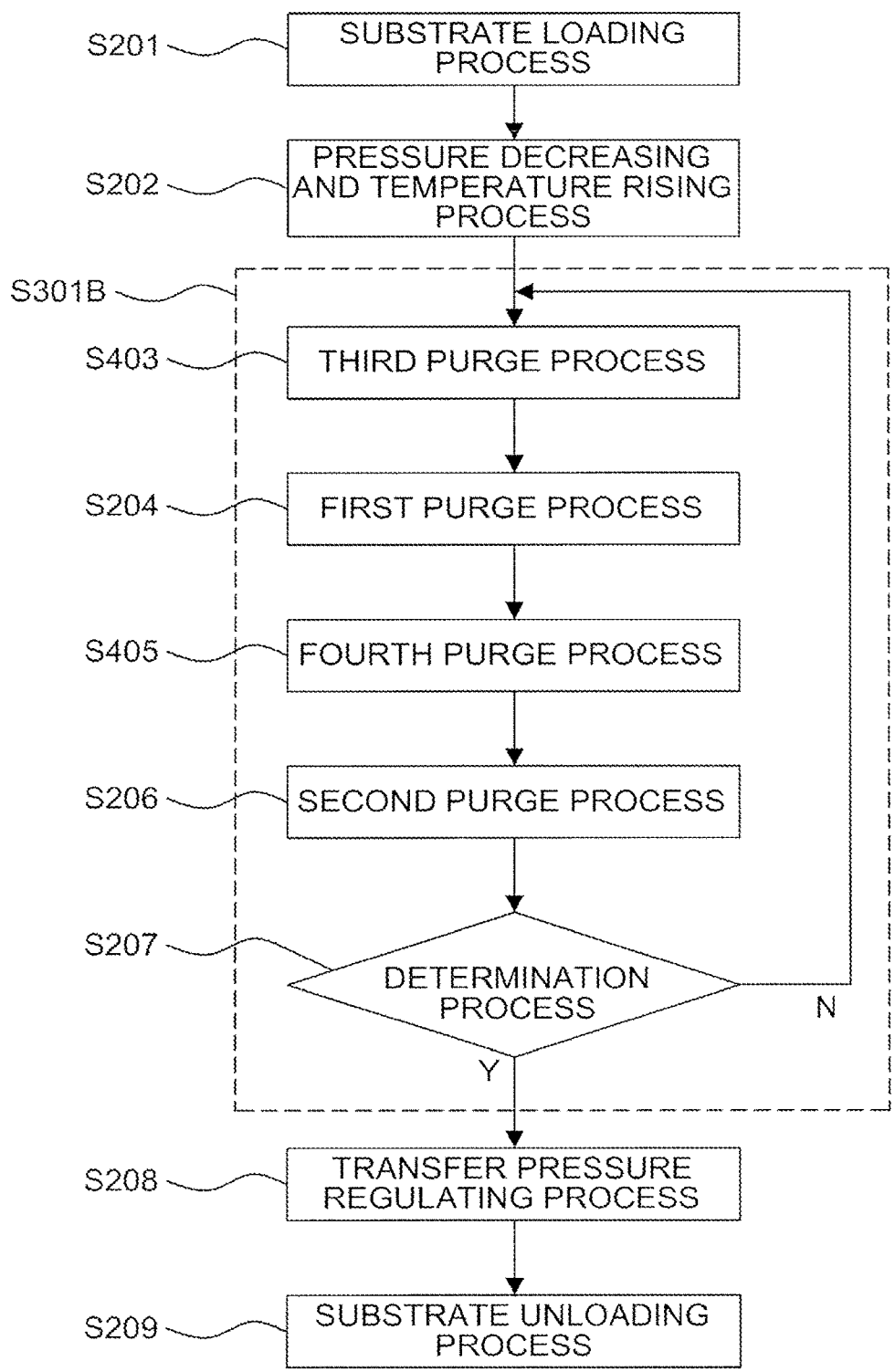
FIG. 9 is a flowchart for describing a second substrate processing process according to an embodiment of the present invention.
Figure 10:
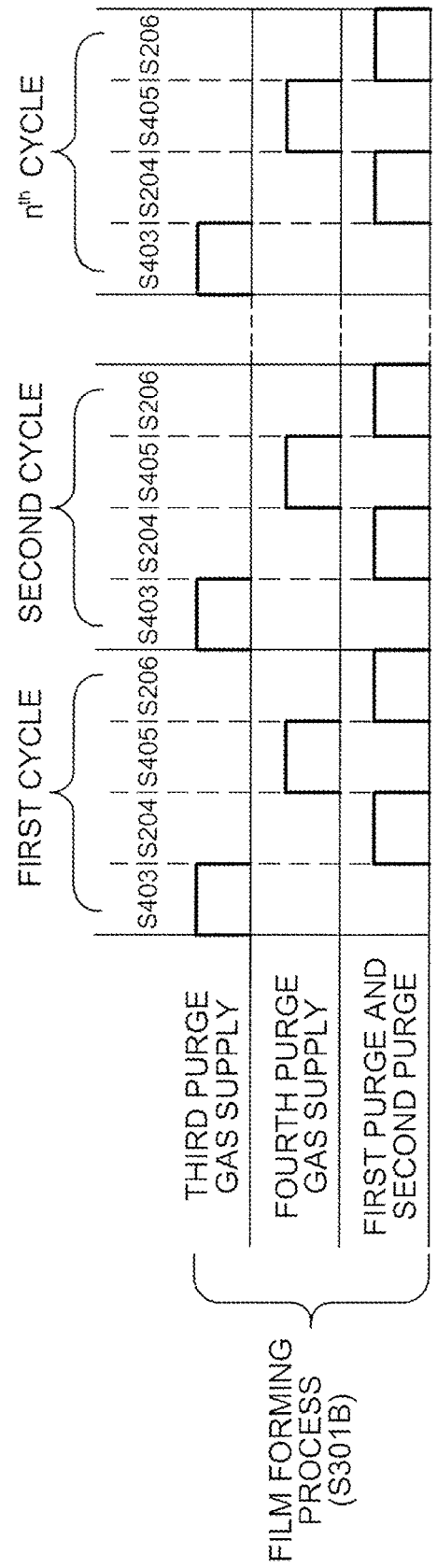
FIG. 10 is a sequence diagram for describing the second substrate processing process according to an embodiment of the present invention.

In the second substrate processing process (S200B), as illustrated in FIGS. 9 and 10, a third purge process (S403) is performed as a process corresponding to the first process gas supply process (S203) of the first film forming process (S301A) of the first substrate processing process (S200A), and a fourth purge process (S405) is performed as a process corresponding to the second process gas supply process (S205) of the first film forming process (S301A). Hereinafter, the third purge process (S403) and the fourth purge process (S405) will be described.

<Third Purge Process (S403)>

In the third purge process (S403), while the first process gas supply process (S203) is performed in the chamber 100*a*, an inert gas is supplied into the process chamber 201 through the first buffer space 232*a* via the fourth gas supply unit. Specifically, in a state in which the wafer 200 is not placed on the substrate placement surface 1311, the valve 146*b* is opened and an inert gas of which a flow rate is adjusted by the MFC 145*b* is supplied into the chamber 100*b* through the first gas supply pipe 111*b*. The flow rate of the inert gas is set so that the exhaustion conductance from the chamber 100*b* in which the second film forming process (S301B) is performed to the process chamber exhaust pipe 224*b* is equal to the exhaustion conductance from the chamber 100*a* in which the first film forming process (S301A) is performed to the process chamber exhaust pipe 224*a*. For example, the flow rate is set to the same flow rate as the flow rate of the first process gas supplied into the chamber 100*a*. Also, when the molecular weight of the first process gas is different from the molecular weight of the inert gas, there is no need to make them the same and the flow rate may be set to be the same exhaustion conductance. Also, although the inert gas is supplied using the fourth gas supply unit in this configuration, a configuration in which it is supplied using the third gas supply unit is also possible. In the configuration in which it is supplied using the third gas supply unit, the number of pipes may be reduced. Meanwhile, in each of the first purge process, the second purge process, the third purge process and the fourth purge process, when the switch of the flow rate is required, it is possible to delay the change of the flow rate. Even in this case, when the fourth gas supply unit is installed, the waiting time for the switch of the flow rate by the MFC 135 may be removed. Also, when the inert gas supplied from the fourth gas supply unit to the process chamber 201 has the same flow rate as that in the supply flow path of the first process gas, balance between the exhaustion conductance of the chamber 100*a* and the exhaustion conductance of the chamber 100*b* is easily maintained. Also, when the conductance difference is within an acceptable range, other flow paths may be used.

In the third purge process (S403), a configuration in which the first buffer space 232*a* is purged either before or after or both before and after the process chamber 201 of each chamber is purged is possible. When the first buffer space 232*a* is purged, the total amount of purge gas supplied into the chamber 100*b* is configured to be the same as the total amount of purge gas supplied into the chamber 100*a*. In this configuration, the exhaust balance between the chamber 100*a* and the chamber 100*b* may also be maintained in the purge process of the first buffer space 232*a*. Also, here, the supply of the purge gas to the first buffer space 232*a* may be performed through the first gas supply pipe 111*a* via the third gas supply unit and may be performed through the first gas supply pipe 111*a* via the fourth gas supply unit.

<Fourth Purge Process (S405)>

In the fourth purge process (S405), while the second process gas supply process (S205) is performed in the chamber 100*a*, an inert gas is supplied into the process chamber 201 through the second buffer space 232*b* via the fourth gas supply unit. Specifically, the valve 156*b* is opened and an inert gas of which a flow rate is adjusted by the MFC 155*b* is supplied into the chamber 100*b* through the second gas supply pipe 121*b*. Also, although the inert gas is supplied using the fourth gas supply unit in this configuration, a configuration in which it is supplied using the third gas supply unit is also possible. Also, the flow rate of the inert gas in the fourth purge process (S405) is set to the same flow rate as the flow rate of the second process gas supplied into the chamber 100*a*. Also, when the molecular weight of the second process gas is different from the molecular weight of the inert gas, there is no need to make them the same and the flow rate may be set to be the same exhaustion conductance. Also, when the inert gas supplied from the fourth gas supply unit to the process chamber 201 has the same flow rate as that in the supply flow path of the second process gas, the balance between the exhaustion conductance of the chamber 100*a* and the exhaustion conductance of the chamber 100*b* is easily maintained. Also, when the conductance difference is within an acceptable range, other flow paths may be used.

Also, in the fourth purge process (S405), a configuration in which the second buffer space 232*b* is purged either before or after or both before and after the process chamber 201 of each chamber is purged is possible. When the second buffer space 232*b* is purged, the total amount of purge gas supplied into the chamber 100*b* is configured to be the same as the total amount of purge gas supplied into the chamber 100*a*. In this configuration, the exhaust balance between the chamber 100*a* and the chamber 100*b* may also be maintained in the purge process of the second buffer space 232*b*. Also, here, the supply of the purge gas to the first buffer space 232*a* may be performed through the first gas supply pipe 111*a* via the third gas supply unit and may be performed through the first gas supply pipe 111*a* via the fourth gas supply unit.

Also, while the fourth purge process (S405) is performed, the second process gas supply process (S205) of the first film forming process is performed in the chamber 100*a*. In the second process gas supply process (S205), when the second process gas is activated and the activated second process gas is supplied only into the chamber 100*a*, the second process gas having high activity may be supplied into the chamber 100*a* compared to the case in which the second process gas supply process (S205) is performed in two chambers [the chamber 100*a* and the chamber 100*b*]. In this case, a configuration in which the activated second process gas is exhausted through the vent line 171*b* while the fourth purge process (S405) is performed is possible. An exhaust amount of the activated second process gas is set to an amount of the gas corresponding to the amount of the gas supplied into the chamber 100*b* in the second process gas supply process (S205). Also, here, although it is illustrated that the vent line 171*b* is installed in an upstream side of the MFC 125*b* as an example, the vent line 171*b* may be installed in a downstream side of the MFC 125*b*. When the vent line 171*b* is installed in the downstream side of the MFC 125*b*, the adjustment of the flow rate may be performed more precisely.

Also, although the method of forming the film in which the source gas and the reactive gas are alternately supplied is described above, other methods may be applied as long as an amount of vapor phase reaction or an amount of by-products of the source gas and the reactive gas is within an acceptable range. For example, there is a method of overlapping the supply times of the source gas and the reactive gas.

Also, the process module is described above as having a pair of chambers, but is not limited thereto. A process module having a set of three or more chambers may be used. When the process module has three or more chambers and the substrate is transferred to one chamber and is not transferred to at least one chamber other than the one chamber, the process gas is supplied to the one chamber and the inert gas is supplied to the other chambers, and thus the above-described effects may be obtained.

Also, the single wafer apparatus in which the substrates are processed one by one is described above, but the present invention is not limited thereto. A batch-type apparatus in which a plurality of substrates are disposed in the process chamber in a vertical direction or a horizontal direction may be used.

Also, although the film forming process is described above, the present invention may be applied to other processes. For example, other processes include diffusion processing, oxidation processing, nitridation processing, oxynitridation processing, reduction processing, oxidation-reduction processing, etching processing, heat processing or the like. For example, the present invention may also be applied when plasma oxidation processing or plasma nitriding processing is performed on a substrate surface or a film formed on the substrate using only the reactive gas. Also, the present invention may be applied when a plasma annealing processing is performed using only the reactive gas.

Also, although the method of manufacturing the semiconductor device is described above, the embodiments of the present invention may be applied to other processes in addition to the process of manufacturing the semiconductor device. For example, the other processes include a process of manufacturing a liquid crystal device (LCD), a process of manufacturing solar cells, a process of manufacturing a light-emitting device (LED), a substrate processing process such as a process of processing a glass substrate, a process of processing a ceramic substrate, a process of processing a conductive substrate or the like.

Also, although an example of the method of forming the silicon oxide film using a silicon-containing gas serving as a source gas and an oxygen-containing gas serving as a reactive gas is described above, the present invention may be applied to other methods of forming the film using other gases. For example, the other films include an oxygen-containing film, a nitrogen-containing film, a carbon-containing film, a boron-containing film, a metal-containing film or a film containing a plurality of these elements. Also, the other films include, for example, a SiN film, an AlO film, a ZrO film, a HfO film, a HfAlO film, a ZrAlO film, a SiC film, a SiCN film, a SiBN film, a TiN film, a TiC film, a TiAlC film or the like. When the characteristic (adsorption characteristic, leaving characteristic, vapor pressure or the like) of each of the source gas and the reactive gas used to form the film is compared and the supply position or the structure in the shower head 234 is appropriately changed, the same effect may be obtained.

According to the technique of the present invention, the productivity of a processing apparatus including a plurality of process chambers can be improved.

<Preferred Embodiments of the Present Invention>

Hereinafter, preferred embodiments according to the present invention are supplementarily noted.

<Supplementary Note 1>

According to an aspect of the present invention, there is provided a substrate processing apparatus or an apparatus of manufacturing a semiconductor device, including:

a plurality of processing units including a plurality of chambers;

a stage where a plurality of storage units loaded with a plurality of substrates are placed;

a first transfer robot configured to transfer the plurality of substrates between the stage and a load lock chamber;

a second transfer robot configured to transfer the plurality of substrates between the load lock chamber and the plurality of chamber; and a control unit configured to control the first transfer robot and the second transfer robot to transfer a last remaining substrate stored in an $x^{th}$ storage unit of the plurality of storage units to an empty $n^{th}$ chamber in an $m^{th}$ processing unit of the plurality of processing units and transfer a first one of the plurality of substrates stored in an $(x+1)^{th}$ storage unit of the plurality of storage units to one of chambers in an $(m+1)^{th}$ processing unit of the plurality of processing units (where x, m and n are natural numbers)

<Supplementary Note 2>

In the substrate processing apparatus or the apparatus of manufacturing the semiconductor device of Supplementary note 1, preferably, the control unit is further configured to record the $n^{th}$ chamber and is further configured to control the second transfer robot to transfer a last remaining substrate stored in the $(x+1)^{th}$ storage unit to an empty $(n+1)^{th}$ chamber.

<Supplementary Note 3>

In the substrate processing apparatus or the apparatus of manufacturing the semiconductor device of any one of Supplementary notes 1 and 2, preferably, the load lock chamber includes a plurality of placement surfaces, and the control unit is further configured to control the first transfer robot so that a placement surface where the last remaining substrate stored in the $x^{th}$ storage unit is different from a placement surface where a last remaining substrate stored in the $(x+1)^{th}$ storage unit.

<Supplementary Note 4>

In the substrate processing apparatus or the apparatus of manufacturing the semiconductor device of any one of Supplementary notes 1 through 3, preferably, the load lock chamber includes a first placement surface and a second placement surface, and the control unit is further configured to control the first transfer robot to transfer a $(4y-1)^{th}$ substrate in the $x^{th}$ storage unit to the first placement surface and transfer a $(4y-3)^{th}$ substrate in the $(x+1)^{th}$ storage unit to the second placement surface (where y is a natural number and x is an odd natural number).

<Supplementary Note 5>

In the substrate processing apparatus or the apparatus of manufacturing the semiconductor device of any one of Supplementary notes 1 through 4, preferably, the number of the plurality of chambers is even.

<Supplementary Note 6>

In the substrate processing apparatus or the apparatus of manufacturing the semiconductor device of any one of Supplementary notes 3 through 5, preferably, the second transfer robot includes an arm where two end effectors supporting at least one of the plurality of substrates are installed.

<Supplementary Note 7>

In the substrate processing apparatus or the apparatus of manufacturing the semiconductor device of Supplementary note 6, preferably, the control unit is further configured to control the second transfer robot to support and transfer a substrate in the load lock chamber to an storage unit of the plurality of storage units.

<Supplementary Note 8>

According to another aspect of the present invention, there is provided a substrate processing method or a method of manufacturing a semiconductor device using an apparatus including: a plurality of processing units including a plurality of chambers; a stage where a plurality of storage units loaded with a plurality of substrates are placed; a first transfer robot configured to transfer the plurality of substrates between the stage and a load lock chamber; and a second transfer robot configured to transfer the plurality of substrates between the load lock chamber and the plurality of chamber, the substrate processing method or the method of manufacturing the semiconductor device including:

(a) transferring a last remaining substrate stored in an $x^{th}$ storage unit of the plurality of storage units to an empty $n^{th}$ chamber in an $m^{th}$ processing unit of the plurality of processing units; and (b) transferring a first one of the plurality of substrates stored in an $(x+1)^{th}$ storage unit of the plurality of storage units to one of chambers in an $(m+1)^{th}$ processing unit of the plurality of processing units (where x, m and n are natural numbers).

<Supplementary Note 9>

In the substrate processing method or the method of manufacturing the semiconductor device of Supplementary note 8, preferably, when the number of substrates stored in one of the plurality of storage units is odd number, further including: recording the nth chamber; and transferring a last remaining substrate stored in the $(x+1)^{th}$ storage unit to an empty $(n+1)^{th}$ chamber.

<Supplementary Note 10>

In the substrate processing method or the method of manufacturing the semiconductor device of any one of Supplementary notes 8 and 9, preferably, the load lock chamber includes a plurality of placement surfaces, and a placement surface where the last remaining substrate stored in the $x^{th}$ storage unit is different from a placement surface where a last remaining substrate stored in the $(x+1)^{th}$ storage unit.

<Supplementary Note 11>

In the substrate processing method or the method of manufacturing the semiconductor device of any one of Supplementary notes 8 through 10, preferably, the load lock chamber includes a first placement surface and a second placement surface, further including: transferring a $(4y-1)^{th}$ substrate in the $x^{th}$ storage unit to the first placement surface; and transferring a $(4y-3)^{th}$ substrate in the $(x+1)^{th}$ storage unit to the second placement surface (where y is a natural number and x is an odd natural number).

<Supplementary Note 12>

In the substrate processing method or the method of manufacturing the semiconductor device of any one of Supplementary notes 8 through 11, preferably, further including: supplying a process gas to a chamber of a processing unit of the plurality of processing units where a substrate is transferred and concurrently supplying an inert gas to an empty chamber of the processing unit.

<Supplementary Note 13>

In the substrate processing method or the method of manufacturing the semiconductor device of Supplementary note 12, preferably, an exhaust conductance of the chamber where the process gas is supplied is the same as an exhaust conductance of the empty chamber where the inert gas is supplied.

<Supplementary Note 14>

According to still another aspect of the present invention, there is provided a program or a non-transitory computer-readable recording medium storing a program for causing a computer to control an apparatus including: a plurality of processing units including a plurality of chambers; a stage where a plurality of storage units loaded with a plurality of substrates are placed; a first transfer robot configured to transfer the plurality of substrates between the stage and a load lock chamber; and a second transfer robot configured to transfer the plurality of substrates between the load lock chamber and the plurality of chamber, to perform:

(a) transferring a last remaining substrate stored in an $x^{th}$ storage unit of the plurality of storage units to an empty chamber in an $m^{th}$ processing unit of the plurality of processing units; and (b) transferring a first one of the plurality of substrates stored in an $(x+1)^{th}$ storage unit of the plurality of storage units to one of chambers in an $(m+1)^{th}$ processing unit of the plurality of processing units (where x and m are natural numbers).

<Supplementary Note 15>

According to still another aspect of the present invention, there is provided a substrate processing apparatus or an apparatus of manufacturing a semiconductor device, including:

a plurality of processing units including a plurality of chambers where a plurality of substrates are processed;

a vacuum transfer chamber connected to the plurality of processing units;

a load lock chamber connected to the vacuum transfer chamber;

a stage where a plurality of storage units loaded with the plurality of substrates are placed;

an atmosphere transfer chamber disposed between the load lock chamber and the stage and having a first transfer robot installed therein;

a second transfer robot disposed in the vacuum transfer chamber and configured to transfer the plurality of substrates between the load lock chamber and the plurality of chamber; and a control unit configured to control the first transfer robot and the second transfer robot to transfer a last remaining substrate stored in an $x^{th}$ storage unit of the plurality of storage units to an empty chamber in an $m^{th}$ processing unit of the plurality of processing units and to transfer a first one of the plurality of substrates stored in an $(x+1)^{th}$ storage unit of the plurality of storage units to one of chambers in an $(m+1)^{th}$ processing unit of the plurality of processing units (where x and m are natural numbers), wherein the plurality of substrates loaded in the plurality of storage units are sequentially transferred to the plurality of chambers and processed.

<Supplementary Note 16>

According to still another aspect of the present invention, there is provided a method for manufacturing a semiconductor device using an apparatus including: a plurality of processing units including a plurality of chambers where a plurality of substrates are processed; a vacuum transfer chamber connected to the plurality of processing units; a load lock chamber connected to the vacuum transfer chamber; a stage where a plurality of storage units loaded with the plurality of substrates are placed; an atmosphere transfer chamber disposed between the load lock chamber and the stage and having a first transfer robot installed therein; and a second transfer robot disposed in the vacuum transfer chamber and configured to transfer the plurality of substrates between the load lock chamber and the plurality of chamber, wherein the plurality of substrates loaded in the plurality of storage units are sequentially transferred to the plurality of chambers and processed, the method including:

(a) recording an $m^{th}$ processing unit of the plurality of processing units where a last remaining substrate stored in an $x^{th}$ storage unit of the plurality of storage units is transferred;

(b) transferring a first one of the plurality of substrates stored in an $(x+1)^{th}$ storage unit of the plurality of storage units to one of chambers in an $(m+1)^{th}$ processing unit of the plurality of processing units (where x and m are natural numbers).

What is claimed is:

1. A method for manufacturing a semiconductor device using an apparatus comprising: a plurality of processing units wherein each of the plurality of processing units comprises an even number of chambers where substrates are processed; a vacuum transfer chamber connected to the plurality of processing units; a load lock chamber connected to the vacuum transfer chamber; a stage where a plurality of storage units each loaded with an odd number of the substrates are placed; an atmosphere transfer chamber disposed between the load lock chamber and the stage and having a first transfer robot installed therein; and a second transfer robot disposed in the vacuum transfer chamber and capable of transferring two substrates at a time between the load lock chamber and the even number of chambers, the method comprising:

(a) transferring one last remaining substrate stored in an $x^{th}$ storage unit of the plurality of storage units to an empty $nt^{th}$ chamber in an $m^{th}$ processing unit of the plurality of processing units and then supplying a process gas into each of the even number of chambers in the $m^{th}$ processing unit to process the substrates;

(b) transferring first two substrates stored in an $(x+1)^{th}$ storage unit of the plurality of storage units to the even number of chambers in an $(m+1)^{th}$ processing unit of the plurality of processing units after transferring the one last remaining substrate into the empty $n^{th}$ chamber in the $m^{th}$ processing unit;

(c) recording a chamber number of the $n^{th}$ chamber where the one last remaining substrate stored in the $x^{th}$ storage unit is transferred into while performing the step (a); and (d) transferring one last remaining substrate stored in the $(x+1)^{th}$ storage unit to an $(n+1)^{th}$ chamber in the $m^{th}$ processing unit after performing the step (b) based on the chamber number recorded in the step (c); wherein x, m and n are natural numbers.

2. The method of claim 1, wherein the last remaining substrate stored in the $x^{th}$ storage unit is transferred to any one of the even number of chambers in one of the plurality of processing units, the method further comprising:

(e) recording a chamber of the $(m+1)^{th}$ processing unit while performing the step (b); and using the chamber number recorded in the step (e) to transfer first two substrates stored in an $(x+2)^{th}$ storage unit to a chamber in the (m+1)th processing unit and then supply the process gas into each of the even number of chambers in the $(m+1)^{th}$ processing unit after performing the step (b).

3. The method of claim 2, wherein the load lock chamber comprises a first placement surface and a second placement surface, the method further comprising:

transferring a $(4y-1)^{th}$ substrate in the $x^{th}$ storage unit to the first placement surface; and transferring a $(4y-3)^{th}$ substrate in the $(x+1)^{th}$ storage unit to the second placement surface; wherein y is a natural number and x is an odd natural number.

4. The method of claim 1, wherein the load lock chamber comprises a plurality of placement surfaces, the method further comprising:

(g) placing the one last remaining substrate stored in the $x^{th}$ storage unit on a first one of the plurality of placement surfaces in the step (a); and (h) placing the one last remaining substrate stored in the $(x+1)^{th}$ storage unit on second one of the plurality of placement surfaces different from the first one of the plurality of placement surfaces in the step (d).

5. The method of claim 4, wherein the load lock chamber comprises a first placement surface and a second placement surface, the method further comprising:

transferring a $(4y-1)^{th}$ substrate in the $x^{th}$ storage unit to the first placement surface; and transferring a $(4y-3)^{th}$ substrate in the $(x+1)^{th}$ storage unit to the second placement surface; wherein y is a natural number and x is an odd natural number.

6. The method of claim 1, wherein the load lock chamber comprises a plurality of placement surfaces, the method further comprising:

(g) placing the one last remaining substrate stored in the $x^{th}$ storage unit on a first one of the plurality of placement surfaces in the step (a);

(h) placing the one last remaining substrate stored in the $(x+1)^{th}$ storage unit on a second one of the plurality of placement surfaces different from the first one of the plurality of placement surfaces in the step (d); and (i) transferring first two substrates of last three substrates remaining in the $(x+1)^{th}$ storage unit to a processing unit different from the $m^{th}$ processing unit to process the first two substrates of the last three substrates before performing the step (d).

7. The method of claim 6, wherein the load lock chamber comprises a first placement surface and a second placement surface, the method further comprising:

transferring a $(4y-1)^{th}$ substrate in the $x^{th}$ storage unit to the first placement surface; and transferring a $(4y-3)^{th}$ substrate in the $(x+1)^{th}$ storage unit to the second placement surface; wherein y is a natural number and x is an odd natural number.

8. The method of claim 1, wherein the load lock chamber comprises a first placement surface and a second placement surface, the method further comprising:

transferring a $(4y-1)^{th}$ substrate in the $x^{th}$ storage unit to the first placement surface; and transferring a $(4y-3)^{th}$ substrate in the $(x+1)^{th}$ storage unit to the second placement surface; wherein y is a natural number and x is an odd natural number.

9. The method of claim 1, further comprising exhausting an atmosphere of the even number of chambers installed in each of the plurality of processing units when the substrates are processed in each of the steps (a) and (b), and wherein even when there is an empty chamber in the $m^{th}$ processing unit in which the last remaining substrate of the $x^{th}$ storage unit is processed, the $(x+1)^{th}$ storage unit skips the empty chamber and starts to be transferred first to the $(m+1)^{th}$ processing unit.

\* \* \* \* \*